(12) United States Patent
Ooms et al.

(10) Patent No.: US 7,342,276 B2
(45) Date of Patent: Mar. 11, 2008

(54) METHOD AND APPARATUS UTILIZING MONOCRYSTALLINE INSULATOR

(75) Inventors: William J. Ooms, Prescott, AZ (US); Jerald A. Hallmark, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 278 days.

(21) Appl. No.: 10/861,467

(22) Filed: Jun. 7, 2004

(65) Prior Publication Data

US 2004/0217444 A1 Nov. 4, 2004

Related U.S. Application Data

(63) Continuation of application No. 09/978,096, filed on Oct. 17, 2001, now abandoned.

(51) Int. Cl.
H01L 27/108 (2006.01)
H01L 29/76 (2006.01)
H01L 29/94 (2006.01)
H01L 31/19 (2006.01)
H01L 31/113 (2006.01)

(52) U.S. Cl. .................. 257/312; 257/300; 257/310; 257/313; 257/396

(58) Field of Classification Search ............. 257/396, 257/300, 310, 312–313
See application file for complete search history.

(56) References Cited

U.S. PATENT DOCUMENTS

| 3,617,951 A | 11/1971 | Anderson | 257/257 |
|---|---|---|---|
| 3,670,213 A | 6/1972 | Nakawaga et al. | 438/291 |
| 3,758,199 A | 9/1973 | Thaxter | 257/316 |
| 3,766,370 A | 10/1973 | Walther | 257/313 |
| 3,802,967 A | 4/1974 | Ladany et al. | 257/300 |
| 3,818,451 A | 6/1974 | Coleman | 257/310 |
| 3,914,137 A | 10/1975 | Huffman et al. | 438/296 |
| 3,935,031 A | 1/1976 | Adler | 438/297 |
| 4,006,989 A | 2/1977 | Andringa | 365/29 |
| 4,043,848 A * | 8/1977 | Bazin | 438/287 |
| 4,084,130 A | 4/1978 | Holton | 257/304 |
| 4,120,588 A | 10/1978 | Chaum | 438/290 |
| 4,146,297 A | 3/1979 | Alferness et al. | 438/298 |
| 4,174,422 A | 11/1979 | Matthews et al. | 257/312 |
| 4,174,504 A | 11/1979 | Chenausky et al. | 257/308 |
| 4,177,094 A | 12/1979 | Kroon | 438/296 |
| 4,242,595 A | 12/1980 | Lehovec | 257/310 |

(Continued)

FOREIGN PATENT DOCUMENTS

DE 196 07 107 8/1997

(Continued)

OTHER PUBLICATIONS

Nakagawara et al., Effects of Buffer Layers in Epitaxial Growth of $SrTiO_3$ Thin Film on Si(100), *J. Appl. Phys.*, 78 (12), Dec. 15, 1995, pp. 7226-7230.

(Continued)

*Primary Examiner*—Ida M. Soward
(74) *Attorney, Agent, or Firm*—Oblon, Spivak, McClelland, Maier & Neustadt, P.C.

(57) ABSTRACT

A semiconductor device, including:
 a semiconductor material;
 a conductive element; and
 a substantially monocrystalline insulator disposed between the semiconductor material and the conductive element and substantially lattice matched to the semiconductor material.

28 Claims, 6 Drawing Sheets

U.S. PATENT DOCUMENTS

| | | | |
|---|---|---|---|
| 4,284,329 A | 8/1981 | Smith et al. | 257/310 |
| 4,289,920 A | 9/1981 | Hovel | 257/315 |
| 4,297,656 A | 10/1981 | Pan | 438/294 |
| 4,298,247 A | 11/1981 | Michelet et al. | 257/275 |
| 4,378,259 A | 3/1983 | Hasegawa et al. | 257/310 |
| 4,392,297 A | 7/1983 | Little | 438/291 |
| 4,398,342 A | 8/1983 | Pitt et al. | 438/296 |
| 4,404,265 A | 9/1983 | Manasevit | 257/329 |
| 4,424,589 A | 1/1984 | Thomas et al. | 438/75 |
| 4,439,014 A | 3/1984 | Stacy et al. | 257/309 |
| 4,442,590 A | 4/1984 | Stockton et al. | 257/295 |
| 4,447,116 A | 5/1984 | King et al. | 257/303 |
| 4,452,720 A | 6/1984 | Harada et al. | 257/304 |
| 4,459,325 A | 7/1984 | Nozawa et al. | 257/309 |
| 4,482,422 A | 11/1984 | McGinn et al. | 257/304 |
| 4,482,906 A | 11/1984 | Hovel et al. | 257/251 |
| 4,484,332 A | 11/1984 | Hawrylo | 257/303 |
| 4,503,540 A | 3/1985 | Nakashima et al. | 438/287 |
| 4,523,211 A | 6/1985 | Morimoto et al. | 257/300 |
| 4,525,871 A | 6/1985 | Foyt et al. | 257/301 |
| 4,594,000 A | 6/1986 | Falk et al. | 257/298 |
| 4,626,878 A | 12/1986 | Kuwano et al. | 438/222 |
| 4,629,821 A | 12/1986 | Bronstein-Bonte et al. | 438/296 |
| 4,661,176 A | 4/1987 | Manasevit | 438/291 |
| 4,667,088 A | 5/1987 | Kramer | 257/299 |
| 4,667,212 A | 5/1987 | Nakamura | 257/306 |
| 4,681,982 A | 7/1987 | Yoshida | 365/121 |
| 4,695,120 A | 9/1987 | Holder | 438/289 |
| 4,723,321 A | 2/1988 | Saleh | 257/305 |
| 4,748,485 A | 5/1988 | Vasudev | 438/195 |
| 4,756,007 A | 7/1988 | Qureshi et al. | 257/310 |
| 4,772,929 A | 9/1988 | Manchester et al. | 257/303 |
| 4,773,063 A | 9/1988 | Hunsperger et al. | 438/298 |
| 4,774,205 A | 9/1988 | Choi et al. | 257/303 |
| 4,777,613 A | 10/1988 | Shahan et al. | 257/303 |
| 4,793,872 A | 12/1988 | Meunier et al. | 257/15 |
| 4,801,184 A | 1/1989 | Revelli | 257/312 |
| 4,802,182 A | 1/1989 | Thornton et al. | 257/314 |
| 4,804,866 A | 2/1989 | Akiyama | 257/298 |
| 4,815,084 A | 3/1989 | Scifres et al. | 438/296 |
| 4,841,775 A | 6/1989 | Ikeda et al. | 438/97 |
| 4,843,609 A | 6/1989 | Ohya et al. | 438/219 |
| 4,845,044 A | 7/1989 | Ariyoshi et al. | 257/296 |
| 4,846,926 A | 7/1989 | Kay et al. | 257/412 |
| 4,855,249 A | 8/1989 | Akasaki et al. | 438/391 |
| 4,866,489 A | 9/1989 | Yokogawa et al. | 430/438 |
| 4,868,376 A | 9/1989 | Lessin et al. | 361/125 |
| 4,872,046 A | 10/1989 | Morkoc et al. | 257/313 |
| 4,876,208 A | 10/1989 | Gustafson et al. | 257/311 |
| 4,876,218 A | 10/1989 | Pessa et al. | 257/313 |
| 4,876,219 A | 10/1989 | Eshita et al. | 361/138 |
| 4,882,300 A | 11/1989 | Inoue et al. | 257/364 |
| 4,885,376 A | 12/1989 | Verkade | 257/296 |
| 4,888,202 A | 12/1989 | Murakami et al. | 458/295 |
| 4,889,402 A | 12/1989 | Reinhart | 257/298 |
| 4,891,091 A | 1/1990 | Shastry | 438/296 |
| 4,896,194 A | 1/1990 | Suzuki | 257/301 |
| 4,901,133 A | 2/1990 | Curran et al. | 438/295 |
| 4,910,164 A | 3/1990 | Shichijo | 257/313 |
| 4,912,087 A | 3/1990 | Aslam et al. | 438/216 |
| 4,928,154 A | 5/1990 | Umeno et al. | 438/203 |
| 4,934,777 A | 6/1990 | Jou et al. | 438/296 |
| 4,952,420 A | 8/1990 | Walters | 365/126 |
| 4,959,702 A | 9/1990 | Moyer et al. | 257/300 |
| 4,963,508 A | 10/1990 | Umeno et al. | 361/265 |
| 4,963,949 A | 10/1990 | Wanlass et al. | 257/363 |
| 4,965,649 A | 10/1990 | Zanio et al. | 438/292 |
| 4,981,714 A | 1/1991 | Ohno et al. | 365/79 |
| 4,984,043 A | 1/1991 | Vinal | 438/200 |
| 4,999,842 A | 3/1991 | Huang et al. | 438/295 |
| 5,018,816 A | 5/1991 | Murray et al. | 257/303 |
| 5,028,563 A | 7/1991 | Feit et al. | 257/297 |
| 5,028,976 A | 7/1991 | Ozaki et al. | 438/298 |
| 5,051,790 A | 9/1991 | Hammer | 365/126 |
| 5,053,835 A | 10/1991 | Horikawa et al. | 257/312 |
| 5,055,445 A | 10/1991 | Belt et al. | 254/309 |
| 5,055,835 A | 10/1991 | Sutton | 257/314 |
| 5,057,694 A | 10/1991 | Idaka et al. | 438/297 |
| 5,060,031 A | 10/1991 | Abrokwah et al. | 438/296 |
| 5,063,081 A | 11/1991 | Cozzette et al. | 438/306 |
| 5,063,166 A | 11/1991 | Mooney et al. | 438/207 |
| 5,064,781 A | 11/1991 | Cambou et al. | 257/300 |
| 5,067,809 A | 11/1991 | Tsubota | 257/307 |
| 5,073,981 A | 12/1991 | Giles et al. | 439/275 |
| 5,075,743 A | 12/1991 | Behfar-Rad | 361/93 |
| 5,081,062 A | 1/1992 | Vasudev et al. | 438/295 |
| 5,081,519 A | 1/1992 | Nishimura | 257/311 |
| 5,087,829 A | 2/1992 | Ishibashi et al. | 257/305 |
| 5,103,494 A | 4/1992 | Mozer | 365/125 |
| 5,116,461 A | 5/1992 | Lebby et al. | 257/305 |
| 5,119,448 A | 6/1992 | Schaefer et al. | 257/300 |
| 5,122,679 A | 6/1992 | Ishii et al. | 257/307 |
| 5,122,852 A | 6/1992 | Chang et al. | 438/296 |
| 5,127,067 A | 6/1992 | Delcoco et al. | 257/312 |
| 5,130,762 A | 7/1992 | Kulick | 257/314 |
| 5,132,648 A | 7/1992 | Trinh et al. | 257/314 |
| 5,140,387 A | 8/1992 | Okazaki et al. | 438/296 |
| 5,140,651 A | 8/1992 | Soref et al. | 257/299 |
| 5,141,894 A | 8/1992 | Bisaro et al. | 438/314 |
| 5,143,854 A | 9/1992 | Pirrung et al. | 257/305 |
| 5,144,409 A | 9/1992 | Ma | 257/294 |
| 5,148,504 A | 9/1992 | Levi et al. | 257/313 |
| 5,155,658 A | 10/1992 | Inam et al. | 257/300 |
| 5,159,413 A | 10/1992 | Calviello et al. | 257/313 |
| 5,163,118 A | 11/1992 | Lorenzo et al. | 257/297 |
| 5,166,761 A | 11/1992 | Olson et al. | 257/298 |
| 5,173,474 A | 12/1992 | Connell et al. | 257/311 |
| 5,173,835 A | 12/1992 | Cornett et al. | 257/302 |
| 5,181,085 A | 1/1993 | Moon et al. | |
| 5,185,589 A | 2/1993 | Krishnaswamy et al. | 257/298 |
| 5,188,976 A | 2/1993 | Kume et al. | 438/295 |
| 5,191,625 A | 3/1993 | Gustavsson | 438/298 |
| 5,194,397 A | 3/1993 | Cook et al. | 257/303 |
| 5,194,917 A | 3/1993 | Regener | 438/299 |
| 5,198,269 A | 3/1993 | Swartz et al. | 257/309 |
| 5,208,182 A | 5/1993 | Narayan et al. | 360/120 |
| 5,210,763 A | 5/1993 | Lewis et al. | 361/121 |
| 5,216,359 A | 6/1993 | Makki et al. | 257/350 |
| 5,216,729 A | 6/1993 | Berger et al. | 257/306 |
| 5,221,367 A | 6/1993 | Chisholm et al. | 257/311 |
| 5,225,031 A | 7/1993 | McKee et al. | 257/310 |
| 5,227,196 A | 7/1993 | Itoh | 257/308 |
| 5,238,877 A | 8/1993 | Russell | 257/302 |
| 5,244,818 A | 9/1993 | Jokers et al. | 361/125 |
| 5,248,564 A | 9/1993 | Ramesh | 257/310 |
| 5,260,394 A | 11/1993 | Tazaki et al. | 257/311 |
| 5,262,659 A | 11/1993 | Grudkowski et al. | 361/122 |
| 5,266,355 A | 11/1993 | Wernberg et al. | 257/315 |
| 5,268,327 A | 12/1993 | Vernon | 257/303 |
| 5,270,298 A | 12/1993 | Ramesh | 361/29 |
| 5,280,013 A | 1/1994 | Newman et al. | 257/303 |
| 5,281,834 A | 1/1994 | Cambou et al. | 257/305 |
| 5,283,462 A | 2/1994 | Stengel | 257/315 |
| 5,286,985 A | 2/1994 | Taddiken | 438/296 |
| 5,293,050 A | 3/1994 | Chapple-Sokol et al. | 438/230 |
| 5,306,649 A | 4/1994 | Hebert | 438/311 |
| 5,310,707 A | 5/1994 | Oishi et al. | 257/314 |
| 5,312,765 A | 5/1994 | Kanber | 257/300 |
| 5,313,058 A | 5/1994 | Friederich et al. | 257/297 |
| 5,314,547 A | 5/1994 | Heremans et al. | 438/291 |
| 5,315,128 A | 5/1994 | Hunt et al. | 438/200 |
| 5,323,023 A | 6/1994 | Fork | 438/297 |
| 5,326,721 A | 7/1994 | Summerfelt | 365/35 |
| 5,334,556 A | 8/1994 | Guldi | 438/297 |

| Patent | Date | Inventor | Class |
|---|---|---|---|
| 5,352,926 A | 10/1994 | Andrews | 257/299 |
| 5,356,509 A | 10/1994 | Terranova et al. | 257/312 |
| 5,356,831 A | 10/1994 | Calviello et al. | 257/312 |
| 5,357,122 A | 10/1994 | Okubora et al. | 257/297 |
| 5,358,925 A | 10/1994 | Neville Connell et al. | 438/208 |
| 5,362,972 A | 11/1994 | Yazawa et al. | 257/300 |
| 5,362,998 A | 11/1994 | Iwamura et al. | 438/295 |
| 5,365,477 A | 11/1994 | Cooper, Jr. et al. | 361/125 |
| 5,371,621 A | 12/1994 | Stevens | 438/396 |
| 5,371,734 A | 12/1994 | Fischer | 257/300 |
| 5,372,992 A | 12/1994 | Itozaki et al. | 257/300 |
| 5,373,166 A | 12/1994 | Buchan et al. | 438/275 |
| 5,387,811 A | 2/1995 | Saigoh | 257/314 |
| 5,391,515 A | 2/1995 | Kao et al. | 438/290 |
| 5,393,352 A | 2/1995 | Summerfelt | 438/214 |
| 5,394,489 A | 2/1995 | Koch | 438/299 |
| 5,395,663 A | 3/1995 | Tabata et al. | 438/295 |
| 5,397,428 A | 3/1995 | Stoner et al. | 257/300 |
| 5,399,898 A | 3/1995 | Rostoker | 257/310 |
| 5,404,581 A | 4/1995 | Honjo | 257/309 |
| 5,405,802 A | 4/1995 | Yamagata et al. | 257/307 |
| 5,406,202 A | 4/1995 | Mehrgardt et al. | 257/300 |
| 5,410,622 A | 4/1995 | Okada et al. | 257/301 |
| 5,418,216 A | 5/1995 | Fork | 438/212 |
| 5,418,389 A | 5/1995 | Watanabe | 257/307 |
| 5,420,102 A | 5/1995 | Harshavardhan et al. | 438/293 |
| 5,427,988 A | 6/1995 | Sengupta et al. | 438/207 |
| 5,430,397 A | 7/1995 | Itoh et al. | 257/310 |
| 5,436,759 A | 7/1995 | Dijaii et al. | 257/313 |
| 5,438,584 A | 8/1995 | Paoli et al. | 257/305 |
| 5,441,577 A | 8/1995 | Sasaki et al. | 257/317 |
| 5,442,191 A | 8/1995 | Ma | 438/295 |
| 5,442,561 A | 8/1995 | Yoshizawa et al. | 257/312 |
| 5,444,016 A | 8/1995 | Abrokwah et al. | 438/295 |
| 5,446,719 A | 8/1995 | Yoshida et al. | 257/307 |
| 5,450,812 A | 9/1995 | McKee et al. | 257/309 |
| 5,452,118 A | 9/1995 | Maruska | 257/312 |
| 5,453,727 A | 9/1995 | Shibasaki et al. | 257/300 |
| 5,466,631 A | 11/1995 | Ichikawa et al. | 257/313 |
| 5,473,047 A | 12/1995 | Shi | 365/122 |
| 5,473,171 A | 12/1995 | Summerfelt | 257/315 |
| 5,477,363 A | 12/1995 | Matsuda | 361/126 |
| 5,478,653 A | 12/1995 | Guenzer | 257/303 |
| 5,479,033 A | 12/1995 | Baca et al. | 257/308 |
| 5,479,317 A | 12/1995 | Ramesh | 257/305 |
| 5,480,829 A | 1/1996 | Abrokwah et al. | 365/135 |
| 5,481,102 A | 1/1996 | Hazelrigg, Jr. | 257/297 |
| 5,482,003 A | 1/1996 | McKee et al. | 257/300 |
| 5,484,664 A | 1/1996 | Kitahara et al. | 365/128 |
| 5,486,406 A | 1/1996 | Shi | 438/299 |
| 5,491,461 A | 2/1996 | Partin et al. | 257/301 |
| 5,492,859 A | 2/1996 | Sakaguchi et al. | 257/317 |
| 5,494,711 A | 2/1996 | Takeda et al. | 360/95 |
| 5,504,035 A | 4/1996 | Rostoker et al. | 257/310 |
| 5,504,183 A | 4/1996 | Shi | 257/309 |
| 5,508,554 A | 4/1996 | Takatani et al. | 438/299 |
| 5,510,665 A | 4/1996 | Conley | 257/297 |
| 5,511,238 A | 4/1996 | Bayraktaroglu | 257/313 |
| 5,512,773 A | 4/1996 | Wolf et al. | 257/373 |
| 5,514,484 A | 5/1996 | Nashimoto | 438/286 |
| 5,514,904 A | 5/1996 | Onga et al. | 257/316 |
| 5,515,047 A | 5/1996 | Yamakido et al. | 361/121 |
| 5,515,810 A | 5/1996 | Yamashita | 257/313 |
| 5,516,725 A | 5/1996 | Chang et al. | 438/293 |
| 5,519,235 A | 5/1996 | Ramesh | |
| 5,523,602 A | 6/1996 | Horiuchi et al. | 257/296 |
| 5,528,052 A * | 6/1996 | Bednorz et al. | 257/39 |
| 5,528,057 A | 6/1996 | Yanagase et al. | 438/300 |
| 5,528,067 A | 6/1996 | Farb et al. | 257/312 |
| 5,528,209 A | 6/1996 | Macdonald et al. | 257/313 |
| 5,528,414 A | 6/1996 | Oakley | 257/300 |
| 5,530,235 A | 6/1996 | Stefik et al. | 257/305 |
| 5,538,941 A | 7/1996 | Findikoglu et al. | 257/301 |
| 5,540,785 A | 7/1996 | Dennard et al. | 257/305 |
| 5,541,422 A | 7/1996 | Wolf et al. | 257/307 |
| 5,548,141 A | 8/1996 | Morris et al. | 257/309 |
| 5,549,977 A | 8/1996 | Jin et al. | 257/312 |
| 5,551,238 A | 9/1996 | Prueitt | 257/302 |
| 5,552,547 A | 9/1996 | Shi | 365/126 |
| 5,553,089 A | 9/1996 | Seki et al. | 438/296 |
| 5,556,463 A | 9/1996 | Guenzer | 257/312 |
| 5,559,368 A | 9/1996 | Hu et al. | 361/121 |
| 5,561,305 A | 10/1996 | Smith | 438/294 |
| 5,569,953 A | 10/1996 | Kikkawa et al. | 438/298 |
| 5,570,226 A | 10/1996 | Ota | 257/301 |
| 5,572,052 A | 11/1996 | Kashihara et al. | 438/293 |
| 5,574,296 A | 11/1996 | Park et al. | 257/315 |
| 5,574,589 A | 11/1996 | Feuer et al. | 438/298 |
| 5,574,744 A | 11/1996 | Gaw et al. | 438/299 |
| 5,576,879 A | 11/1996 | Nashimoto | 257/307 |
| 5,578,162 A | 11/1996 | D'Asaro et al. | 438/290 |
| 5,585,167 A | 12/1996 | Satoh et al. | 257/257 |
| 5,585,288 A | 12/1996 | Davis et al. | 438/298 |
| 5,588,995 A | 12/1996 | Sheldon | 438/275 |
| 5,589,284 A | 12/1996 | Summerfelt et al. | 259/310 |
| 5,596,205 A | 1/1997 | Reedy et al. | 257/312 |
| 5,596,214 A | 1/1997 | Endo | 257/313 |
| 5,602,418 A | 2/1997 | Imai et al. | 257/313 |
| 5,603,764 A | 2/1997 | Matsuda et al. | 438/291 |
| 5,606,184 A | 2/1997 | Abrokwah et al. | 257/299 |
| 5,608,046 A | 3/1997 | Cook et al. | 257/356 |
| 5,610,744 A | 3/1997 | Ho et al. | 257/307 |
| 5,614,739 A | 3/1997 | Abrokwah et al. | 257/313 |
| 5,619,051 A | 4/1997 | Endo | 257/305 |
| 5,621,227 A | 4/1997 | Joshi | 257/303 |
| 5,623,439 A | 4/1997 | Gotoh et al. | 257/300 |
| 5,623,552 A | 4/1997 | Lane | 257/306 |
| 5,625,202 A * | 4/1997 | Chai | 257/94 |
| 5,629,534 A | 5/1997 | Inuzuka et al. | 438/298 |
| 5,633,724 A | 5/1997 | King et al. | 257/303 |
| 5,635,433 A | 6/1997 | Sengupta | 438/295 |
| 5,635,453 A | 6/1997 | Pique et al. | 257/305 |
| 5,640,267 A | 6/1997 | May et al. | 257/307 |
| 5,642,371 A | 6/1997 | Tohyama et al. | 257/305 |
| 5,650,646 A | 7/1997 | Summerfelt | 438/298 |
| 5,656,382 A | 8/1997 | Nashimoto | 257/313 |
| 5,659,180 A | 8/1997 | Shen et al. | 257/301 |
| 5,661,112 A | 8/1997 | Hatta et al. | 438/297 |
| 5,666,376 A | 9/1997 | Cheng | 257/296 |
| 5,667,586 A | 9/1997 | Ek et al. | 257/300 |
| 5,668,048 A | 9/1997 | Kondo et al. | 257/309 |
| 5,670,798 A | 9/1997 | Schetzina | 257/300 |
| 5,670,800 A | 9/1997 | Nakao et al. | 257/315 |
| 5,674,366 A | 10/1997 | Hayashi et al. | 257/308 |
| 5,674,813 A | 10/1997 | Nakamura et al. | 438/297 |
| 5,679,947 A | 10/1997 | Doi et al. | 257/311 |
| 5,679,965 A | 10/1997 | Schetzina | 257/301 |
| 5,682,046 A | 10/1997 | Takahashi et al. | 257/300 |
| 5,684,302 A | 11/1997 | Wersing et al. | 257/307 |
| 5,686,741 A | 11/1997 | Ohori et al. | 257/307 |
| 5,689,123 A | 11/1997 | Major et al. | 257/301 |
| 5,693,140 A | 12/1997 | McKee et al. | 361/122 |
| 5,696,392 A | 12/1997 | Char et al. | 438/197 |
| 5,719,417 A | 2/1998 | Roeder et al. | 257/309 |
| 5,725,641 A | 3/1998 | MacLeod | 257/307 |
| 5,729,394 A | 3/1998 | Sevier et al. | 257/309 |
| 5,729,641 A | 3/1998 | Chandonnet et al. | 257/305 |
| 5,731,220 A | 3/1998 | Tsu et al. | 361/125 |
| 5,733,641 A | 3/1998 | Fork et al. | 257/301 |
| 5,734,672 A | 3/1998 | McMinn et al. | 257/311 |
| 5,735,949 A | 4/1998 | Mantl et al. | 257/310 |
| 5,741,724 A | 4/1998 | Ramdani et al. | 257/315 |
| 5,745,631 A | 4/1998 | Reinker | 438/300 |
| 5,753,300 A | 5/1998 | Wessels et al. | 438/212 |
| 5,753,928 A | 5/1998 | Krause | 257/316 |
| 5,753,934 A | 5/1998 | Yano et al. | 257/312 |

| | | | | | | | |
|---|---|---|---|---|---|---|---|
| 5,754,319 A | 5/1998 | Van De Voorde et al. | 257/302 | 5,959,308 A | 9/1999 | Shichijo et al. | 361/122 |
| 5,754,714 A | 5/1998 | Suzuki et al. | 438/295 | 5,959,879 A | 9/1999 | Koo | 257/315 |
| 5,760,426 A | 6/1998 | Marx et al. | 438/301 | 5,962,069 A | 10/1999 | Schindler et al. | 438/315 |
| 5,760,427 A | 6/1998 | Onda | 438/200 | 5,963,291 A | 10/1999 | Wu et al. | 257/310 |
| 5,760,740 A | 6/1998 | Blodgett | 257/309 | 5,966,323 A | 10/1999 | Chen et al. | 257/298 |
| 5,764,676 A | 6/1998 | Paoli et al. | 257/306 | 5,976,953 A | 11/1999 | Zavracky et al. | 257/312 |
| 5,767,543 A | 6/1998 | Ooms et al. | 438/293 | 5,977,567 A | 11/1999 | Verdiell | 257/299 |
| 5,770,887 A | 6/1998 | Tadatomo et al. | 438/297 | 5,981,400 A | 11/1999 | Lo | 438/193 |
| 5,772,758 A | 6/1998 | Collins et al. | 257/312 | 5,981,976 A | 11/1999 | Murasato | 257/305 |
| 5,776,359 A | 7/1998 | Schultz et al. | 438/290 | 5,981,980 A | 11/1999 | Miyajima et al. | 257/293 |
| 5,776,621 A | 7/1998 | Nashimoto | 257/312 | 5,984,190 A | 11/1999 | Nevill | 257/300 |
| 5,777,350 A | 7/1998 | Nakamura et al. | 257/300 | 5,985,404 A | 11/1999 | Yano et al. | 438/295 |
| 5,777,762 A | 7/1998 | Yamamoto | 438/290 | 5,986,301 A | 11/1999 | Fukushima et al. | 257/375 |
| 5,778,018 A | 7/1998 | Yoshikawa et al. | 438/295 | 5,987,011 A | 11/1999 | Toh | 438/297 |
| 5,778,116 A | 7/1998 | Tomich | 257/301 | 5,987,196 A | 11/1999 | Noble | 257/298 |
| 5,780,311 A | 7/1998 | Beasom et al. | 257/308 | 5,990,495 A | 11/1999 | Ohba | 365/54 |
| 5,789,733 A | 8/1998 | Jachimowicz et al. | 438/291 | 5,995,359 A | 11/1999 | Klee et al. | 257/298 |
| 5,789,845 A | 8/1998 | Wadaka et al. | 257/296 | 5,995,528 A | 11/1999 | Fukunaga et al. | 365/75 |
| 5,790,583 A | 8/1998 | Ho | 438/291 | 5,997,638 A | 12/1999 | Copel et al. | 257/303 |
| 5,792,569 A | 8/1998 | Sun et al. | 257/309 | 5,998,781 A | 12/1999 | Vawter et al. | 430/290 |
| 5,792,679 A | 8/1998 | Nakato | 257/316 | 5,998,819 A | 12/1999 | Yokoyama et al. | 257/312 |
| 5,796,648 A | 8/1998 | Kawakubo et al. | 257/303 | 6,002,375 A | 12/1999 | Corman et al. | 438/298 |
| 5,801,072 A | 9/1998 | Barber | 438/290 | 6,008,762 A | 12/1999 | Nghiem | 257/300 |
| 5,801,105 A | 9/1998 | Yano et al. | 438/203 | 6,011,641 A | 1/2000 | Shin et al. | 257/296 |
| 5,807,440 A | 9/1998 | Kubota et al. | 257/301 | 6,011,646 A | 1/2000 | Mirkarimi et al. | 257/300 |
| 5,810,923 A | 9/1998 | Yano et al. | 257/313 | 6,013,553 A | 1/2000 | Wallace et al. | 257/312 |
| 5,812,272 A | 9/1998 | King et al. | 257/307 | 6,020,222 A | 2/2000 | Wollesen | 438/298 |
| 5,814,583 A | 9/1998 | Itozaki et al. | 257/307 | 6,022,140 A | 2/2000 | Fraden et al. | 257/301 |
| 5,825,055 A | 10/1998 | Summerfelt | 438/290 | 6,022,410 A | 2/2000 | Yu et al. | 257/257 |
| 5,825,799 A | 10/1998 | Ho et al. | 438/290 | 6,022,671 A | 2/2000 | Binkley et al. | 257/309 |
| 5,827,755 A | 10/1998 | Yonchara et al. | 257/298 | 6,022,963 A | 2/2000 | McGall et al. | 257/311 |
| 5,828,080 A | 10/1998 | Yano et al. | 257/313 | 6,023,082 A | 2/2000 | McKee et al. | 438/298 |
| 5,830,270 A | 11/1998 | McKee et al. | 257/300 | 6,028,853 A | 2/2000 | Haartsen | 257/301 |
| 5,831,960 A | 11/1998 | Jiang et al. | 257/310 | 6,039,803 A | 3/2000 | Fitzgerald et al. | 257/311 |
| 5,833,603 A | 11/1998 | Kovacs et al. | 257/300 | 6,045,626 A | 4/2000 | Yano et al. | 257/399 |
| 5,834,362 A | 11/1998 | Miyagaki et al. | 257/296 | 6,046,464 A | 4/2000 | Schetzina | 257/312 |
| 5,838,035 A | 11/1998 | Ramesh | 257/307 | 6,048,751 A | 4/2000 | D'Asaro et al. | 257/302 |
| 5,838,053 A | 11/1998 | Bevan et al. | 257/312 | 6,049,110 A | 4/2000 | Koh | 257/307 |
| 5,844,260 A | 12/1998 | Ohori | 257/301 | 6,049,702 A | 4/2000 | Tham et al. | 257/312 |
| 5,846,846 A | 12/1998 | Suh et al. | 438/296 | 6,051,858 A | 4/2000 | Uchida et al. | 257/310 |
| 5,852,687 A | 12/1998 | Wickham | 438/298 | 6,051,874 A | 4/2000 | Masuda | 257/298 |
| 5,857,049 A | 1/1999 | Beranek et al. | 257/300 | 6,055,179 A | 4/2000 | Koganei et al. | 295/313 |
| 5,858,814 A | 1/1999 | Goossen et al. | 361/121 | 6,058,131 A | 5/2000 | Pan | 257/312 |
| 5,861,966 A | 1/1999 | Ortel | 365/122 | 6,059,895 A | 5/2000 | Chu et al. | 438/221 |
| 5,863,326 A | 1/1999 | Nause et al. | 257/316 | 6,064,078 A | 5/2000 | Northrup et al. | 257/302 |
| 5,864,171 A | 1/1999 | Yamamoto et al. | 438/175 | 6,064,092 A | 5/2000 | Park | 257/302 |
| 5,869,845 A | 2/1999 | Vander Wagt et al. | 257/310 | 6,064,783 A | 5/2000 | Congdon et al. | 257/313 |
| 5,872,493 A | 2/1999 | Ella | 438/298 | 6,078,717 A | 6/2000 | Nashimoto et al. | 257/301 |
| 5,873,977 A | 2/1999 | Desu et al. | 257/295 | 6,080,378 A | 6/2000 | Yokota et al. | 438/271 |
| 5,874,860 A | 2/1999 | Brunel et al. | 361/175 | 6,083,697 A | 7/2000 | Beecher et al. | 438/302 |
| 5,878,175 A | 3/1999 | Sonoda et al. | 257/307 | 6,087,681 A | 7/2000 | Shakuda | 257/315 |
| 5,879,956 A | 3/1999 | Seon et al. | 438/298 | 6,088,216 A | 7/2000 | Laibowitz et al. | 438/298 |
| 5,880,452 A | 3/1999 | Plesko | 257/309 | 6,090,659 A | 7/2000 | Laibowitz et al. | 257/301 |
| 5,882,948 A | 3/1999 | Jewell | 257/311 | 6,093,302 A | 7/2000 | Montgomery | 257/313 |
| 5,883,564 A | 3/1999 | Partin | 430/295 | 6,096,584 A | 8/2000 | Ellis-Monaghan et al. | 257/313 |
| 5,883,996 A | 3/1999 | Knapp et al. | 257/301 | 6,100,578 A | 8/2000 | Suzuki | 257/299 |
| 5,886,867 A | 3/1999 | Chivukula et al. | 257/298 | 6,103,008 A | 8/2000 | McKee et al. | 438/295 |
| 5,888,296 A | 3/1999 | Ooms et al. | 257/296 | 6,103,403 A | 8/2000 | Grigorian et al. | 257/296 |
| 5,889,296 A | 3/1999 | Imamura et al. | 257/297 | 6,107,653 A | 8/2000 | Fitzgerald | 257/305 |
| 5,896,476 A | 4/1999 | Wisseman et al. | 257/298 | 6,107,721 A | 8/2000 | Lakin | 438/299 |
| 5,905,571 A | 5/1999 | Butler et al. | 257/307 | 6,108,125 A | 8/2000 | Yano | 438/212 |
| 5,907,792 A | 5/1999 | Droopad et al. | 257/311 | 6,110,813 A | 8/2000 | Ota et al. | 257/300 |
| 5,912,068 A | 6/1999 | Jia | 438/290 | 6,110,840 A | 8/2000 | Yu | 257/300 |
| 5,919,515 A | 7/1999 | Yano et al. | 257/372 | 6,113,225 A | 9/2000 | Miyata et al. | 365/175 |
| 5,919,522 A | 7/1999 | Baum et al. | 257/301 | 6,113,690 A | 9/2000 | Yu et al. | 257/303 |
| 5,926,493 A | 7/1999 | O'Brien et al. | 438/207 | 6,114,996 A | 9/2000 | Nghiem | 257/307 |
| 5,926,496 A | 7/1999 | Ho et al. | 257/200 | 6,121,642 A | 9/2000 | Newns | 438/76 |
| 5,937,115 A | 8/1999 | Domash | 257/298 | 6,121,647 A | 9/2000 | Yano et al. | 438/295 |
| 5,937,274 A | 8/1999 | Kondow et al. | 438/299 | 6,128,178 A | 10/2000 | Newns | 361/108 |
| 5,937,285 A | 8/1999 | Abrokwah et al. | 257/296 | 6,134,114 A | 10/2000 | Ungermann et al. | 438/793 |
| 5,948,161 A | 9/1999 | Kizuki | 438/275 | 6,136,666 A | 10/2000 | So | 257/304 |
| 5,953,468 A | 9/1999 | Finnila et al. | 438/295 | 6,137,603 A | 10/2000 | Henmi | 257/296 |
| 5,955,591 A | 9/1999 | Imbach et al. | 257/297 | 6,139,483 A | 10/2000 | Seabaugh et al. | 257/310 |

| | | | | | | | |
|---|---|---|---|---|---|---|---|
| 6,140,746 | A | 10/2000 | Miyashita et al. ............ 257/297 | 6,338,756 | B2 | 1/2002 | Dietze ....................... 438/292 |
| 6,143,072 | A | 11/2000 | McKee et al. .................. 365/95 | 6,339,664 | B1 | 1/2002 | Farjady et al. ............... 257/296 |
| 6,143,366 | A | 11/2000 | Lu ............................. 257/307 | 6,340,788 | B1 | 1/2002 | King et al. ................... 365/125 |
| 6,146,906 | A | 11/2000 | Inoue et al. ................. 257/304 | 6,341,851 | B1 | 1/2002 | Takayama et al. .......... 257/312 |
| 6,150,239 | A | 11/2000 | Goesele et al. .............. 438/296 | 6,343,171 | B1 | 1/2002 | Yoshimura et al. ......... 257/313 |
| 6,151,240 | A | 11/2000 | Suzuki ........................ 438/313 | 6,345,424 | B1 | 2/2002 | Hasegawa et al. ........... 257/301 |
| 6,153,010 | A | 11/2000 | Kiyoku et al. ............... 257/312 | 6,348,373 | B1 | 2/2002 | Ma et al. ..................... 257/302 |
| 6,153,454 | A | 11/2000 | Krivokapic ................. 257/303 | 6,355,945 | B1 | 3/2002 | Kadota et al. ............... 257/305 |
| 6,156,581 | A | 12/2000 | Vaudo et al. ................ 257/312 | 6,359,330 | B1 | 3/2002 | Goudard ...................... 257/299 |
| 6,173,474 | B1 | 1/2001 | Conrad ........................ 257/312 | 6,362,017 | B1 | 3/2002 | Manabe et al. ............... 257/312 |
| 6,174,755 | B1 | 1/2001 | Manning ..................... 257/303 | 6,362,558 | B1 | 3/2002 | Fukui ......................... 257/303 |
| 6,175,497 | B1 | 1/2001 | Tseng et al. ................. 257/293 | 6,367,699 | B2 | 4/2002 | Ackley ....................... 257/295 |
| 6,175,555 | B1 | 1/2001 | Hoole ......................... 257/300 | 6,372,356 | B1 | 4/2002 | Thornton et al. ............ 257/311 |
| 6,180,252 | B1 | 1/2001 | Farrell et al. ................ 257/301 | 6,372,813 | B1 | 4/2002 | Johnson et al. .............. 438/300 |
| 6,180,486 | B1 | 1/2001 | Leobandung et al. ........ 438/299 | 6,376,337 | B1 | 4/2002 | Wang et al. .................. 438/296 |
| 6,181,920 | B1 | 1/2001 | Dent et al. ................... 257/300 | 6,389,209 | B1 | 5/2002 | Suhir ......................... 257/307 |
| 6,184,044 | B1 | 2/2001 | Sone et al. ................... 257/306 | 6,391,674 | B2 | 5/2002 | Ziegler ....................... 430/298 |
| 6,184,144 | B1 | 2/2001 | Lo ............................. 365/121 | 6,392,253 | B1 | 5/2002 | Saxena ....................... 438/296 |
| 6,191,011 | B1 | 2/2001 | Gilboa et al. ................ 438/298 | 6,392,257 | B1 * | 5/2002 | Ramdani et al. ............ 257/190 |
| 6,194,753 | B1 | 2/2001 | Seon et al. ................... 365/73 | 6,393,167 | B1 | 5/2002 | Davis et al. ................. 257/306 |
| 6,197,503 | B1 | 3/2001 | Vo-Dinh et al. ............. 257/314 | 6,404,027 | B1 | 6/2002 | Hong et al. .................. 438/295 |
| 6,198,119 | B1 | 3/2001 | Nabatame et al. ........... 438/298 | 6,410,941 | B1 | 6/2002 | Taylor et al. ................ 257/312 |
| 6,204,525 | B1 | 3/2001 | Sakurai et al. ............... 361/31 | 6,410,947 | B1 | 6/2002 | Wada ......................... 257/301 |
| 6,204,737 | B1 | 3/2001 | Ella ............................ 257/311 | 6,411,756 | B2 | 6/2002 | Sadot et al. .................. 438/297 |
| 6,208,453 | B1 | 3/2001 | Wessels et al. .............. 257/308 | 6,415,140 | B1 | 7/2002 | Benjamin et al. ............ 438/298 |
| 6,210,988 | B1 | 4/2001 | Howe et al. ................. 257/314 | 6,417,059 | B2 | 7/2002 | Huang ........................ 257/311 |
| 6,211,096 | B1 | 4/2001 | Allman et al. ............... 257/300 | 6,419,849 | B1 | 7/2002 | Qiu et al. .................... 361/122 |
| 6,222,654 | B1 | 4/2001 | Frigo .......................... 367/125 | 6,427,066 | B1 | 7/2002 | Grube ......................... 438/291 |
| 6,224,669 | B1 | 5/2001 | Yi et al. ...................... 257/311 | 6,432,546 | B1 | 8/2002 | Ramesh et al. .............. 257/217 |
| 6,225,051 | B1 | 5/2001 | Sugiyama et al. ............ 438/298 | 6,438,281 | B1 | 8/2002 | Tsukamoto et al. .......... 257/295 |
| 6,229,159 | B1 | 5/2001 | Suzuki ........................ 259/298 | 6,445,724 | B2 | 9/2002 | Abeles ....................... 257/301 |
| 6,232,242 | B1 | 5/2001 | Hata et al. ................... 361/125 | 6,452,232 | B1 | 9/2002 | Adan .......................... 257/312 |
| 6,232,806 | B1 | 5/2001 | Woeste et al. ............... 257/295 | 6,461,927 | B1 | 10/2002 | Mochizuki et al. .......... 438/298 |
| 6,232,910 | B1 | 5/2001 | Bell et al. .................... 257/301 | 6,462,360 | B1 | 10/2002 | Higgins, Jr. et al. ......... 438/298 |
| 6,233,435 | B1 | 5/2001 | Wong ......................... 257/298 | 6,477,285 | B1 | 11/2002 | Shanley ...................... 257/298 |
| 6,235,145 | B1 | 5/2001 | Li et al. ...................... 438/310 | 6,496,469 | B1 | 12/2002 | Uchizaki ..................... 257/309 |
| 6,238,946 | B1 | 5/2001 | Ziegler ....................... 257/297 | 6,498,358 | B1 | 12/2002 | Lach et al. ................... 257/302 |
| 6,239,012 | B1 | 5/2001 | Kinsman ..................... 257/296 | 6,501,121 | B1 | 12/2002 | Yu et al. ..................... 365/120 |
| 6,239,449 | B1 | 5/2001 | Fafard et al. ................ 257/318 | 6,504,189 | B1 | 1/2003 | Matsuda et al. .............. 257/309 |
| 6,253,649 | B1 | 5/2001 | Kawahara et al. ........... 275/319 | 6,524,651 | B2 | 2/2003 | Gan et al. .................... 257/298 |
| 6,241,821 | B1 | 6/2001 | Yu et al. ..................... 257/301 | 6,528,374 | B2 | 3/2003 | Bojarczuk, Jr. et al. ..... 365/312 |
| 6,242,686 | B1 | 6/2001 | Kishimoto et al. ........... 257/295 | 6,538,359 | B1 | 3/2003 | Hiraku et al. ................ 257/310 |
| 6,248,459 | B1 | 6/2001 | Wang et al. .................. 257/302 | 6,589,887 | B1 | 7/2003 | Dalton et al. ................ 438/315 |
| 6,248,621 | B1 | 6/2001 | Wilk et al. ................... 257/309 | 6,638,872 | B1 * | 10/2003 | Croswell et al. ............. 438/695 |
| 6,252,261 | B1 | 6/2001 | Usui et al. ................... 438/297 | 2001/0013313 | A1 | 8/2001 | Droopad et al. ............. 438/296 |
| 6,255,198 | B1 | 7/2001 | Linthicum et al. ........... 257/307 | 2001/0020278 | A1 | 9/2001 | Saito .......................... 438/297 |
| 6,256,426 | B1 | 7/2001 | Duchet ....................... 257/295 | 2001/0024885 | A1 * | 9/2001 | Hata et al. ................... 438/778 |
| 6,265,749 | B1 | 7/2001 | Gardner et al. .............. 438/296 | 2001/0036142 | A1 | 11/2001 | Kadowaki et al. ........... 257/296 |
| 6,268,269 | B1 | 7/2001 | Lee et al. .................... 438/299 | 2001/0055820 | A1 | 12/2001 | Sakurai et al. ............... 257/312 |
| 6,271,619 | B1 | 8/2001 | Yamada et al. .............. 257/304 | 2002/0006245 | A1 | 1/2002 | Kubota et al. ............... 257/303 |
| 6,275,122 | B1 | 8/2001 | Speidell et al. .............. 257/305 | 2002/0008234 | A1 | 1/2002 | Emrick ....................... 438/294 |
| 6,277,436 | B1 | 8/2001 | Stauf et al. .................. 257/300 | 2002/0021855 | A1 | 2/2002 | Kim ........................... 257/307 |
| 6,278,137 | B1 | 8/2001 | Shimoyama et al. ........ 438/276 | 2002/0030246 | A1 | 3/2002 | Eisenbeiser et al. ......... 438/200 |
| 6,278,138 | B1 | 8/2001 | Suzuki ........................ 257/230 | 2002/0047123 | A1 | 4/2002 | Ramdani et al. ............ 257/310 |
| 6,278,523 | B1 | 8/2001 | Gorecki ...................... 257/310 | 2002/0047143 | A1 | 4/2002 | Ramdani et al. ............ 257/302 |
| 6,278,541 | B1 | 8/2001 | Baker ......................... 438/275 | 2002/0052061 | A1 | 5/2002 | Fitzgerald ................... 257/300 |
| 6,291,319 | B1 | 9/2001 | Yu et al. ..................... 438/298 | 2002/0072245 | A1 | 6/2002 | Ooms et al. ................. 257/307 |
| 6,291,866 | B1 | 9/2001 | Wallace ...................... 257/305 | 2002/0076878 | A1 | 6/2002 | Wasa et al. .................. 438/220 |
| 6,297,598 | B1 | 10/2001 | Wang et al. .................. 438/298 | 2002/0079576 | A1 | 6/2002 | Seshan ....................... 257/300 |
| 6,297,842 | B1 | 10/2001 | Koizumi et al. ............. 438/197 | 2002/0131675 | A1 | 9/2002 | Litvin ......................... 257/313 |
| 6,300,615 | B1 | 10/2001 | Shinohara et al. ........... 257/311 | 2002/0140012 | A1 | 10/2002 | Droopad ...................... 365/290 |
| 6,306,668 | B1 | 10/2001 | McKee et al. ............... 438/126 | 2002/0145168 | A1 | 10/2002 | Bojarczuk, Jr. et al. ..... 365/123 |
| 6,307,996 | B1 | 10/2001 | Nashimoto et al. .......... 257/371 | 2002/0167005 | A1 * | 11/2002 | Yu et al. ...................... 257/43 |
| 6,312,819 | B1 | 11/2001 | Jia et al. ...................... 430/300 | 2002/0179000 | A1 | 12/2002 | Lee et al. .................... 257/307 |
| 6,313,486 | B1 | 11/2001 | Kencke et al. ............... 257/305 | 2002/0195610 | A1 | 12/2002 | Klosowiak ................... 257/309 |
| 6,316,785 | B1 | 11/2001 | Nunoue et al. ............... 257/299 | 2003/0020069 | A1 * | 1/2003 | Holmes et al. ............... 257/76 |
| 6,316,832 | B1 | 11/2001 | Tsuzuki et al. ............... 438/292 | | | | |
| 6,319,730 | B1 | 11/2001 | Ramdani et al. ............ 257/304 | | | FOREIGN PATENT DOCUMENTS | |
| 6,320,238 | B1 | 11/2001 | Kizilyalli et al. ............ 438/295 | | | | |
| 6,326,637 | B1 | 12/2001 | Parkin et al. | DE | 197 12 496 | | 10/1997 |
| 6,326,645 | B1 | 12/2001 | Kadota ....................... 438/298 | DE | 198 29 609 | | 1/2000 |
| 6,326,667 | B1 | 12/2001 | Sugiyama et al. ............ 438/299 | DE | 100 17 137 | | 10/2000 |
| 6,329,277 | B1 | 12/2001 | Liu et al. ..................... 257/301 | EP | 0 247 722 | | 12/1987 |

| | | | | | | |
|---|---|---|---|---|---|---|
| EP | 0 250 171 | 12/1987 | | JP | 63-131104 | 6/1988 |
| EP | 0 300 499 | 1/1989 | | JP | 63-198365 | 8/1988 |
| EP | 0 309 270 | 3/1989 | | JP | 63-289812 | 11/1988 |
| EP | 0 331 338 | 9/1989 | | JP | 64-50575 | 2/1989 |
| EP | 0 331 467 | 9/1989 | | JP | 64-52329 | 2/1989 |
| EP | 0 342 937 | 11/1989 | | JP | 1-102435 | 4/1989 |
| EP | 0 392 714 | 10/1990 | | JP | 1-179411 | 7/1989 |
| EP | 0 412 002 | 2/1991 | | JP | 01-196809 | 8/1989 |
| EP | 0 455 526 | 6/1991 | | JP | 03-149882 | 11/1989 |
| EP | 0 483 993 | 5/1992 | | JP | HEI 2-391 | 1/1990 |
| EP | 0 494 514 | 7/1992 | | JP | 02051220 | 2/1990 |
| EP | 0 514 018 | 11/1992 | | JP | 3-41783 | 2/1991 |
| EP | 0 538 611 | 4/1993 | | JP | 03046384 | 2/1991 |
| EP | 0 581 239 | 2/1994 | | JP | 3-171617 | 7/1991 |
| EP | 0 600 658 | 6/1994 | | JP | 03-188619 | 8/1991 |
| EP | 0 602 568 | 6/1994 | | JP | 5-48072 | 2/1993 |
| EP | 0 607 435 | 7/1994 | | JP | 5-086477 | 4/1993 |
| EP | 0 614 256 | 9/1994 | | JP | 5-152529 | 6/1993 |
| EP | 0 619 283 | 10/1994 | | JP | 05150143 | 6/1993 |
| EP | 0 630 057 | 12/1994 | | JP | 05 221800 | 8/1993 |
| EP | 0 661 561 | 7/1995 | | JP | 5-232307 | 9/1993 |
| EP | 0 860 913 | 8/1995 | | JP | 5-238894 | 9/1993 |
| EP | 0 682 266 | 11/1995 | | JP | 5-243525 | 9/1993 |
| EP | 0 711 853 | 5/1996 | | JP | 5-291299 | 11/1993 |
| EP | 0 766 292 | 4/1997 | | JP | 06-069490 | 3/1994 |
| EP | 0 777 379 | 6/1997 | | JP | 6-232126 | 8/1994 |
| EP | 0 810 666 | 12/1997 | | JP | 6-291299 | 10/1994 |
| EP | 0 828 287 | 3/1998 | | JP | 6-334168 | 12/1994 |
| EP | 0 852 416 | 7/1998 | | JP | 0812494 | 1/1996 |
| EP | 0 875 922 | 11/1998 | | JP | 9-67193 | 3/1997 |
| EP | 0 881 669 | 12/1998 | | JP | 9-82913 | 3/1997 |
| EP | 0 884 767 | 12/1998 | | JP | 10-256154 | 9/1998 |
| EP | 0 926 739 | 6/1999 | | JP | 10-269842 | 10/1998 |
| EP | 0 957 522 | 11/1999 | | JP | 10-303396 | 11/1998 |
| EP | 0 964 259 | 12/1999 | | JP | 10-321943 | 12/1998 |
| EP | 0 964 453 | 12/1999 | | JP | 11135614 | 5/1999 |
| EP | 0 993 027 | 4/2000 | | JP | 11-238683 | 8/1999 |
| EP | 0 999 600 | 5/2000 | | JP | 11-260835 | 9/1999 |
| EP | 1 001 468 | 5/2000 | | JP | 01 294594 | 11/1999 |
| EP | 1 035 759 | 9/2000 | | JP | 11340542 | 12/1999 |
| EP | 1 037 272 | 9/2000 | | JP | 2000-068466 | 3/2000 |
| EP | 1 043 426 | 10/2000 | | JP | 2 000 1645 | 6/2000 |
| EP | 1 043 427 | 10/2000 | | JP | 2000-278085 | 10/2000 |
| EP | 1 043 765 | 10/2000 | | JP | 2000-349278 | 12/2000 |
| EP | 1 054 442 | 11/2000 | | JP | 2000-351692 | 12/2000 |
| EP | 1 069 605 | 1/2001 | | JP | 2001006529 A * | 1/2001 |
| EP | 1 069 606 | 1/2001 | | JP | 2001-196892 | 7/2001 |
| EP | 1 085 319 | 3/2001 | | JP | 2002-9366 | 1/2002 |
| EP | 1 089 338 | 4/2001 | | WO | WO 92/10875 | 6/1992 |
| EP | 1 109 212 | 6/2001 | | WO | WO 93/07647 | 4/1993 |
| EP | 1 176 230 | 1/2002 | | WO | WO 94/03908 | 2/1994 |
| FR | 2 779 843 | 12/1999 | | WO | WO 95/02904 | 1/1995 |
| GB | 1 319 311 | 6/1970 | | WO | WO 97/45827 | 12/1997 |
| GB | 2 152 315 | 7/1985 | | WO | WO 98/05807 | 1/1998 |
| GB | 2 335 792 | 9/1999 | | WO | WO 98/20606 | 5/1998 |
| JP | 52-88354 | 7/1977 | | WO | WO 99/14797 | 3/1999 |
| JP | 52-89070 | 7/1977 | | WO | WO 99/14804 | 3/1999 |
| JP | 52-135684 | 11/1977 | | WO | WO 99/19546 | 4/1999 |
| JP | 54-134554 | 10/1979 | | WO | WO 99/63580 | 12/1999 |
| JP | 55-87424 | 7/1980 | | WO | WO 99/67882 | 12/1999 |
| JP | 58-075868 | 5/1983 | | WO | WO 00/06812 | 2/2000 |
| JP | 58-213412 | 12/1983 | | WO | WO 00/16378 | 3/2000 |
| JP | 59-044004 | 3/1984 | | WO | WO 00/33363 | 6/2000 |
| JP | 59-073498 | 4/1984 | | WO | WO 00/48239 | 8/2000 |
| JP | 59066183 | 4/1984 | | WO | WO 01/04943 A1 | 1/2001 |
| JP | 60-161635 | 8/1985 | | WO | WO 01/16395 | 3/2001 |
| JP | 60-210018 | 10/1985 | | WO | WO 01/33585 | 5/2001 |
| JP | 60-212018 | 10/1985 | | WO | WO 01/37330 | 5/2001 |
| JP | 61-36981 | 2/1986 | | WO | WO 01/59814 A2 | 8/2001 |
| JP | 61-63015 | 4/1986 | | WO | WO 01/59820 A1 | 8/2001 |
| JP | 61-108187 | 5/1986 | | WO | WO 01/59821 A1 | 8/2001 |
| JP | 62-245205 | 10/1987 | | WO | WO 01/59837 | 8/2001 |
| JP | 63-34994 | 2/1988 | | WO | WO 02 01648 | 1/2002 |

| | | |
|---|---|---|
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/09150 | 1/2002 |
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/LiNbO$_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", *Science*, vol. 276, Apr. 11, 1997, pp. 238-240.

R. Houdre et al., "Properties of GaAs on Si Grown by Molecular Beam Epitaxy," *Solid State and Materials Sciences*, vol. 16, Issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27$^{th}$ International Symposium on Compound Semiconductors, Oct. 2000.

Zogg et al., "Progress in Compound-Semiconductor-on-Silicon-Heteroepitaxy with Fluoride Buffer Layers," *J. Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-To-Quasi-Bound Quantum-Well Infrared Photodetectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/(100) GaAs Interface," *Appl. Phys Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si Epi/MgO-Al$_2$O$_3$Epi./SiO$_3$/Si and Its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143-150.

T. Chikyow et al., "Reaction and Regrowth Control of CeO$_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated Mems Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21. No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7$^{th}$ Int'l Workshop on, 2000; pp. 64-65.

S.S. Lu, et al.; "Piezoelectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, May 12, 1994, vol. 30, No. 10; pp. 823-825.

Kihong Kim, et al."On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter With Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1-3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid State Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/Al$_x$O$_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6. Jun. 2000; pp. 807-812.

D.E. Aspnes, et al.; "Steps on (001) silicon surfaces"; J. Vac. Sci. Technol. B, vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Shichijo, et al.; "GaAs MESFET and Si CMOS Cointegration and Circuit Techniques"; 1988 IEEE; GaAs IC Symposium- 239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electronic Device Letters, vol. 20, No. 10, Oct. 1999; pp. 507-509.

Tomonori Nagashima, et al.; "Three-Terminal Tandem Solar Cells With a Back-Contact Type Bottom Cell" Higashifujl Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on -$Al_2O_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(0001) using high-temperature monocrystalline AlN buffer layers" 320 Applied Physics Letters, vol. 67, No. 3, Jul. 17, 1995, pp. 1401-1403.

Z. Yu, et al.; "Epitaxial oxide thin films on SI(001)"; J. Vac. Sci. Technol. B. vol. 18, No. 4, Jul./Aug. 2000; pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zintl-phase Ca(Si1-xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GainAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers in situ Annealed at High Temperatures, *8257b Journal of Vacuum Science & Technology*, May/Jun. 1995, vol. 13, No. 3, pp. 1000-1005.

Cuomo et al., "Substrate Effect on the Superconductivity of $YBa_2Cu_3O_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institute of Physics*, pp. 782-784, Aug. 13, 1991.

Tambo et al., Molecular Beam Epitaxy Growth of $SrTiO_3$ Films on Si(100)-2×1 with SrO Buffer Layer, *Jpn. J. Appl. Phys.*, vol. 37, 1998, pp. 4454-4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309-314.

McKee et al., "$BaSi_2$ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136.

Brian A. Floyd, et al.; "The projected Power Consumption of a Wireless Clock Distribution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," *Mat. Res. Soc.*, Symposium Proceedings, vol. 116, pp. 369-374, Apr. 5-8, 1988.

Douglas B. Chrisey, et al; Pulsed Laser Deposition of Thin Films: pp. 273-285.

B.A. Block, et al; "Photoluminescence properties of $Er^{3}$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Meetingk 1996; IEEE Hong Kong: Jun. 29, 1996; pp. 60-63, XP010210167.

Wenhua Zhu et al.; "Molecular Beam Epitaxy of GaAs on Si-on-Insulator"; 320 Applied Physics Letters 59 Jul. 8, 1991 No. 2; pp. 210-212.

Umesh K. Mishra et al; "Oxide Based Compound Semiconductor Electronics"; Electron Devices Meeting; 1997; Technical Digest, International: Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143-14146.

Q.-Y. Tong et al.; "IOS—a new type of materials combination for system-on-a chip preparation"; 1999 IEEE International SOI Conference, Oct. 1999; pp. 104-105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Eptiaxial $TiO_2$ and $BaTiO_3/TiO_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63 Dec. 27, 1993; No. 26; pp. 3592-3594.

K. Eisenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3/SrTiO_3/La_{0.8}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C; vol. 282-287, No. 2003; Aug. 1, 1997; pp. 1231-1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8, Apr. 15, 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $ZnO/SiO_2/Si$ Monolithic Integrated Programmable SAW Filter"; Proceedings of Fifth International Conference on Solid-State and Integrated Circuit Technology; Oct. 21-23, 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration Of InGaAs/InAlAs MODFETs and RTDs on InP-bonded-to Si SUBSTRATE"; Fourth International Conference on Indium Phosphide and Related Materials, Newport, RI, USA; Apr. 21-24, 1992 ; pp. 167-170; XP000341253; IEEE, New York, NY, USA; ISBN: 0-7803-0522-1.

H. Takahashi et al.; "Arrayed-Waveguide Grating For Wavelength Division Multi/Demultiplexer With Nanometre REsolution"; Electronics Letters; vol. 26., No. 2, Jan. 18, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y Wu et al.; "Highly Oriented $(Pb,La)(Zr,Ti)O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al.; "$PbTiO_3$/Thin Films Grown by Organometallic Chemical Vapour Deposition"; Third International Symposium on Integrated Ferroelectrics; Apr. 3-5, 1991 (Abstract).

P.J. Borrelli et al.; "Compositional and Structural Properties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. Phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/Si(001) Heterojunctions"; Applied Physics Letters; vol. 77, No. 11; Sep. 11, 2000; pp. 1662-1664.

H. Wang et al.; "GaAs/GaAIAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26, 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 Dec. 10, 1989; No. 1; pp. 213-225.

K. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

Charles Kittel; "Introduction to Solid State Physics"; John Wiley & Sons, Inc. Fifth Edition; pp. 415.

Chyuan-Wei Chen et al; "Liquid-phase epitaxial growth and characterization of InGaAsP layers grown on GaAsP substrates for application to orange light-emitting diodes"; 931 Journal of Applied Physics; 77 Jan. 15, 1995, No. 2; Woodbury, NY, US; pp. 905-909.

W. Zhu et al. ; "Oriented diamond films grown on nickel substrates"; 320 Applied Physics Letters; 63(1993) September, No. 12, Woodbury, NY, US; pp. 1640-1642.

M. Schreck et al. ; "Diamond/Ir/SrTi03: A material combination for improved heteroepitaxial diamond films"; Applied Physics Letters; vol. 74, No. 5; Feb. 1, 1999; pp. 650-652.

Yoshihiro Yokota et al. ; "Cathodoluminescence of boron-doped heteroepitaxial diamond films on platinum"; Diamond and Related Materials 8(1999) ; pp. 1587-1591.

J. R. Busch et al. ; "Linear Electro-Optic Response In Sol-Gel PZT Planar Waveguide" ; Electronics Letters; Aug. 13, 1992; vol. 28, No. 17; pp. 1591-1592.

R. Droopad et al ; "Epitaxial Oxide Films on Silicon: Growth, Modeling and Device Properties"; Mat. Res. Soc. Symp. Proc. vol. 619; 2000 Materials Research Society; pp. 155-165.

H. Ohkubo et al. ; "Fabrication of High Quality Perovskite Oxide Films by Lateral Epitaxy Verified with RHEED Oscillation" ; 2419A Int. Conf. on Solid State Devices & Materials, Tsukuba, Aug. 26-28, 1992; pp. 457-459.

Lin Li; "Ferroelectric/Superconductor Heterostructures"; Materials Science and Engineering; 29 (2000) pp. 153-181.

L. Fan et al. ; "Dynaamic Beam Switching of Vertical-Cavity Surface-Emitting Lasers with Integrated Optical Beam Routers" ; IEEE Photonics Technology Letters; vol. 9, No. 4; Apr. 4, 1997; pp. 505-507.

Y. Q. Xu. et al. ; "(Mn, Sb) dropped-Pb(Zr, Ti)03 infrared detector arrays" ; Journal of Applied Physics; vol. 88, No. 2; Jul. 15, 2000; pp. 1004-1007.

Kiyoko Kato et al. ; "Reduction of dislocations in InGaAs layer on GaAs using epitaxial lateral overgrowth"; 2300 Journal of Crystal Growth 115 (1991) pp. 174-179; Dec. 1991.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001pp. 1-3.

"Holy Grail! Motorola Claims High-Yield GaAs Breakthrough"; Micromagazine.com (no date available); pp. 1-3.

Jong-Gul Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LiTaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458-1460.

Dwight C. Streit et al; "High Reliability GaAs-AIGaAs HBT's by MBE with Be Base Doping and InGaAs Emitter Contacts"; 8179 Ieee Electron Device Letters; 12(1991) September, No. 9, New York, US.

C. Y. Hung et al; "Piezoelectrically induced stress tuning of electro-optic devices"; 320 Applied Physics Letters; 59 Dec. 30, 1991, No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some aspects of designing an efficient nitride VCSEL resonator"; J. Phys. D: Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of BaZrO3 at low oxygen partial pressure"; Journal of Crystal Growth 243 (2002); pp. 164-169.

M.E. Hawley; et al; "Microstructural Study of Colossal Magneto-Resistive Films As a Function of Growth Temperature, As Deposited and Annealed"; 401, 1996; pp. 531-536.

Yi W. et al; "Mechanism of cleaning Si (100) surface using Sr and SrO for the growth of crystalline SrTiO/sub 2/films" Journal of Vacuum Science & Technology, vol. 20, No. 4, Jul. 2002 pp. 1402-1405.

Xiaming Hu et al; "Sr/Si template formation for the epitaxial growth of SrTiO/sub 3/on silicon" Materials Research Society Proceedings, vol. 716, 2002, pp. 261-266.

* cited by examiner

METHOD AND APPARATUS UTILIZING MONOCRYSTALLINE INSULATOR

This application is a continuation of application Ser. No. 09/978,096, filed Oct. 17, 2001 now abandoned.

FIELD OF THE INVENTION

The invention relates generally to semiconductor devices, methods, and systems.

BACKGROUND OF THE INVENTION

Semiconductor devices typically comprise multiple layers of conductive, insulative, and semiconductive layers. Crystalline materials, such as silicon, are often employed to serve various functions, especially in the semiconductor and insulator materials. Various properties of such layers tend to improve with the crystallinity of the layer. For example, electron charge displacement and electron energy recoverability of an insulative layer improve as the crystallinity of the layer increases. The amount of charge that can be stored is a function of the dielectric constant of the insulative layer. Further, improved insulative properties tend to reduce the power consumption and size of various components, such as capacitors.

For example, a capacitor generally comprises two conductive elements separated by a dielectric layer. Single-crystal materials exhibit excellent insulative properties, but efforts to construct capacitors with single-crystal dielectric layers have not been particularly successful. These attempts have generally been unsuccessful, at least in part, because lattice mismatches between the host crystal and the grown crystal cause the resulting layer to be of low crystalline quality. Such efforts commonly result in polycrystalline dielectric materials, and the insulating properties of such materials are compromised by defects and grain boundaries. Defects and grain boundaries tend to allow greater leakage current through the dielectric layer, degrading the effectiveness of the insulator. Consequently, conventional devices typically include additional protection layers to prevent the inclusion of foreign materials, defects, and grain boundaries.

To reduce the leakage current, many capacitors include additional dielectric layers, typically formed from amorphous materials, such as amorphous zirconium titanate. Adding layers, however, requires additional processing steps and materials. Further, the properties of such layers are more difficult to control than crystalline materials.

SUMMARY OF THE INVENTION

A semiconductor method and apparatus according to various aspects of the present invention may include a capacitor having a substantially monocrystalline material exhibiting a relatively high dielectric constant. The semiconductor apparatus and method may further include a supplemental layer having a depletion zone, suitably comprised of a high-resistivity material. To facilitate the growth of the insulator and/or other layers, the various layers are suitably lattice matched. Further, the apparatus may include one or more interface layers to facilitate lattice matching of the various layers.

BRIEF DESCRIPTION OF THE DRAWINGS

The present invention is illustrated by way of example and not limitation in the accompanying figures, in which like references indicate similar elements, and in which.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The subject matter of the present invention is particularly suited for use in connection with semiconductor devices, such as semiconductor capacitors. As a result, the preferred exemplary embodiment of the present invention is described in that context. It should be recognized, however, that such description is not intended as a limitation on the use or applicability of the present invention, but is instead provided merely to enable a full and complete description of a preferred embodiment. Various aspects of the present invention may be applied to a variety of semiconductor devices, such as insulators for devices like insulated gate transistors or other components using high dielectric materials.

A system according to various aspects of the present invention may include one or more semiconductor devices. In the present embodiment, the semiconductor devices include capacitors. Generally, capacitors comprise two conductive elements, such as substantially conductive or semi-conductive materials, separated by an electrical insulator. A system according to various aspects of the present invention may include a semiconductor device having a voltage variable capacitor, also known as a varactor, variable capacitance diode, or varacap, which suitably comprises a semiconductor device characterized by voltage sensitive capacitance that resides in the space-charge region at the surface of a semiconductor bounded by an insulating layer.

To form a high performance voltage variable capacitor, a dielectric film, suitably having a sufficiently thin cross section and adequate integrity, may be provided on the semiconductor.

Figure 1:
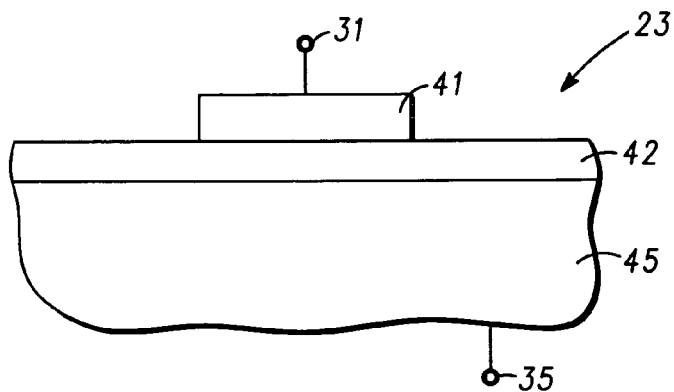
FIG. 1 illustrates a cross-section of a semiconductor apparatus according to various aspects of the present invention having a substantially monocrystalline dielectric layer.

Referring to FIG. 1, a semiconductor device according to various aspects of the present invention includes a capacitor 23. The capacitor 23 suitably comprises a first conductive element, such as a semiconductor substrate 45, and a dielectric layer 42 having a relatively high dielectric constant formed on top of the semiconductor substrate 45 as the insulator. A second conductive element, such as a top electrode 41, is formed on the dielectric layer 42.

The first conductive element may be comprised of any appropriate materials, for example silicon or gallium arsenide. The substrate 45, for example, may be conventionally doped, such as with n+ doping, or comprise multiple materials to achieve desired electrical properties. Further, the substrate 45 may be uniformly doped, or may have areas of greater concentration of dopants to achieve any appropriate electrical characteristics. Similarly, the second conductive element comprises any suitable material, such as a highly conductive material for a capacitor. In the present embodiment, the electrode 41 comprises a conductive metal such as platinum, copper, gold, silver, or aluminum, or may comprise other conductive or semiconductive materials, such as polysilicon or a conductive oxide. The electrode 41 is electrically coupled to an electrode connection 31 and the substrate 45 is electrically coupled to a substrate connection 35.

The dielectric layer 42 separates the substrate 45 and electrode 41. The dielectric layer 42 comprises any suitable material for inhibiting current between the substrate 45 and the electrode 41, such as an alkaline earth metal oxide. In the present embodiment, the dielectric layer 42 comprises a substantially monocrystalline film of any suitable material. Dielectric layer 42 may be, in various embodiments, a monocrystalline oxide or nitride material selected for its crystalline compatibility with the underlying substrate and with the overlying material layer, as well as its insulating properties. For example, the material may be an oxide or nitride having a lattice structure closely matched to the substrate.

In accordance with various aspects of the present invention, dielectric layer 42 comprises a substantially monocrystalline film of strontium titanate. Monocrystalline films of dielectric materials typically exhibit higher dielectric constants than amorphous or polycrystalline films of the same material. In alternative embodiments, the dielectric layer 42 is formed from any appropriate substantially monocrystalline material having various desired properties, such as resistivity, heat resistance, lattice coefficients, and the like. For example, the dielectric layer 42 may comprise a metal oxide compound, such as barium, strontium, titanium, zirconium, lanthanum, or aluminum, or a combination of one or more of these metals and/or other materials. Strontium titanate ($SrTiO_3$), for example, has a dielectric constant of over 200 in monocrystalline form. Other suitable materials for dielectric layer 42 include $BaTiO_3$, $LaAlO_3$, $SrZrO_3$, $BaZrO_3$ and MgO. Materials that may be suitable for the dielectric layer include, but are not limited to, metal oxides such as alkaline earth metal titanates, alkaline earth metal zirconates, alkaline earth metal hafnates, alkaline earth metal tantalates, alkaline earth metal niobates, alkaline earth metal vanadates, alkaline earth metal tin-based perovskites, lanthanum aluminate, lanthanum scandium oxide, gadolinium oxide, and/or alkaline earth oxides. Additionally, various nitrides such as gallium nitride, aluminum nitride, and boron nitride may also be used for the dielectric layer 42. Generally, these materials are metal oxides or metal nitrides, and more particularly, these metal oxide or nitrides typically include one or two different metallic elements. In some applications, the metal oxides or nitrides may include three or more different metallic elements.

Figure 2:
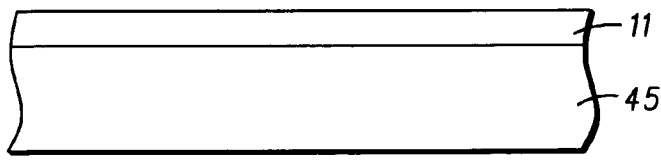
FIGS. 2, 3, 4, and 5 illustrate schematically, in cross section, device structures in various stages of layer preparation.

The dielectric layer 42 may be formed according to any suitable technique, such as molecular beam epitaxy, vapor phase epitaxy, pulsed laser deposition, sputtering, evaporation, chemical vapor deposition, ion beam, plasma, sol-gel, or solution chemistry processes. Various suitable processes for forming the dielectric layer 42, for example, are described in U.S. Pat. No. 6,022,410, issued Feb. 8, 2000, to Yu, et al.; U.S. Pat. No. 6,113,690, issued Sep. 5, 2000, to Yu, et al.; U.S. Pat. No. 6,224,669, issued May 1, 2001, to Yu, et al.; and U.S. Pat. No. 6,241,821, issued Jun. 5, 2001, to Yu, et al. For example, referring to FIG. 2, a native oxide 11 may exist on the surface of the substrate 45 from exposure to ambient air. The native oxide typically has a thickness in the range of 10 to 30 Å. The native oxide layer 11 is suitably removed to provide an ordered crystalline surface on the substrate 45 for nucleation of the dielectric layer 42. Thicker native oxide layers tend to require longer exposure to the selected conversion material. To remove the native oxide and expose the monocrystalline surface on the substrate 45, the silicon substrate 45 and amorphous native oxide layer 11 are heated to a temperature below the sublimation temperature of the native oxide layer 11. Generally, the native oxide sublimes at a temperature in excess of 850° C., so that silicon substrate 45 is heated, preferably, to a temperature in a range of about 700° C. to 800° C. at reduced pressure, such as in the range of approximately $10^{-9}$ to $10^{-10}$ Torr.

Figure 3:
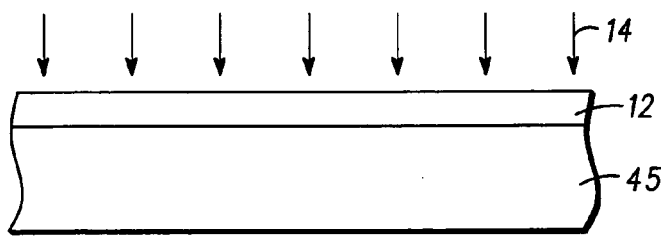

The surface of the silicon substrate 45 having the native oxide layer 11 is suitably exposed to a beam of a conversion material 14 (FIG. 3) for removing the native oxide layer and forming a template layer for the dielectric layer 42, such as an alkaline earth metal or a combination of an alkaline earth metal and oxygen. For example, the conversion material 14 may comprise barium, strontium, or a combination of the two that is generated by resistively heating effusion cells or from e-beam evaporation sources.

In the present exemplary embodiment, silicon substrate 45 and native oxide layer 11 are exposed to a beam of strontium. The strontium aids in desorption of the native oxide layer 11 at lower temperatures than would otherwise be required. An amount of strontium remains on the silicon surface to form a template layer 12 such as may be indicated by a (2×1) reconstruction in a Reflection High Energy Electron Diffraction (RHEED) pattern. As the amorphous native oxide layer 11 is exposed to a beam of alkaline earth metal(s), the surface is preferably monitored using RHEED techniques which can be used in situ, i.e. while performing the exposing step, for example within a growth chamber. The RHEED techniques are used to detect or sense surface crystalline structures and, in the present embodiment, change rapidly from diffuse background for the amorphous silicon oxide to strong and sharp streaks upon the completion of the native oxide desorption process. Once a specific manufacturing process is provided and followed, however, it may not be necessary or desirable to perform the RHEED techniques on every substrate.

Figure 4:
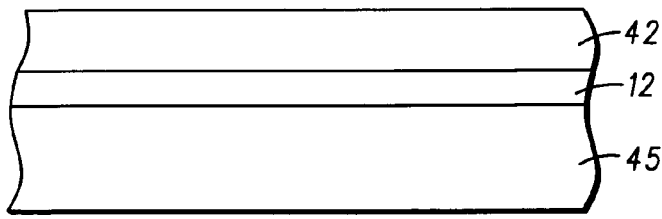
Figure 5:
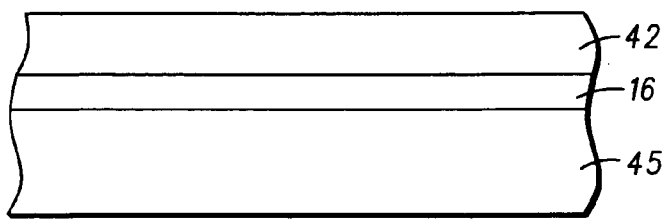

The cleaned silicon substrate is then lowered to between 200° C. and 600° C. A $SrTiO_3$ layer 42 may then be deposited on the template layer 12 by exposing it to a beam of strontium, titanium and oxygen. Referring to FIG. 4, a high dielectric crystalline material 42 is deposited on the template layer 12. By controlling the partial pressure of oxygen during the growth of the crystalline material 42, an optional amorphous interface layer 16 can be formed between the silicon substrate 10 and the dielectric 42 as shown in FIG. 5. The amorphous interface layer 16 is formed by oxygen diffusing through the dielectric 42 and reacting with the surface of the silicon substrate 45. Even though the amorphous interface layer 16 is formed at the interface between the silicon substrate 45 and the dielectric layer 42, the dielectric layer still remains single crystalline. The formation of the amorphous interface layer 16 can consume a portion of the silicon surface, or the template layer 12, or a portion of the crystalline material 42.

To facilitate or enhance the growth of other layers, a semiconductor system in accordance with various aspects of the present invention may also include one or more interface layers. Interface layers may be formed between some or all of the various layers, and suitably comprise additional layers of crystalline materials. For example, referring to FIG. 6, an alternative embodiment of a capacitor 24 includes an interface layer 43 formed between the semiconductor substrate 45 and the dielectric layer 42. The interface layer 43 may be formed in any suitable manner, for example in the same manner as the dielectric layer 42. In the present embodiment, the interface layer 43 suitably comprises a monocrystalline material, suitably a different material than used to form the substrate 45 and the dielectric layer 42. The interface layer 43 assists in the proper formation of the subsequent dielectric layer, suitably acting as a template layer for subsequent growth of the dielectric layer 42.

In semiconductor devices according to various aspects of the present invention, the crystalline structures of a first layer such as a high-resistivity layer 44 (described below) or semiconductor substrate 45, a second layer such as the dielectric layer 42, and in some embodiments a third layer, such as the interface layer 43, may be substantially matched. For example, the interface layer 43 may be substantially lattice matched to the substrate 45 and the dielectric layer 42. The interface layer 43 suitably has a lattice constant slightly higher than that of the substrate 45 and slightly lower than that of the dielectric layer 42, or is suitably oriented at an angle to the lattice of the substrate to assist in obtaining a desired orientation of the dielectric layer 42.

Figure 7:
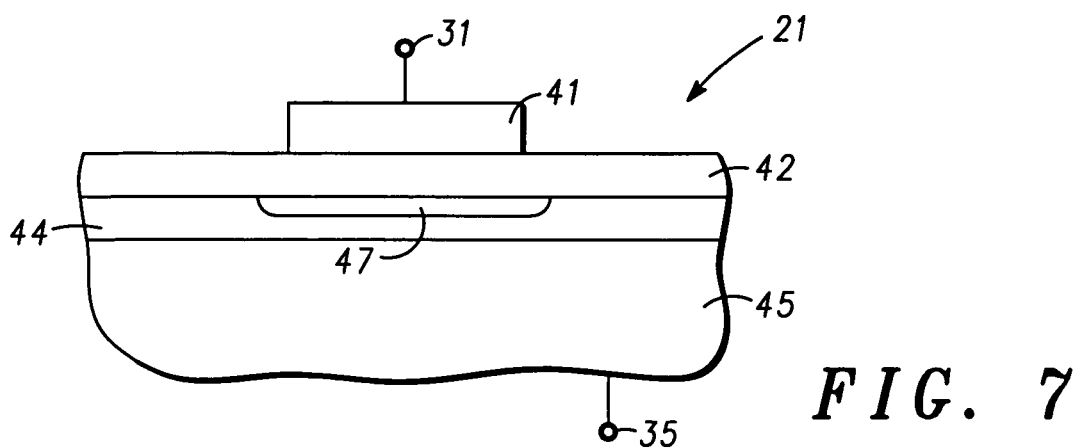
FIG. 7 illustrates a cross-section of a semiconductor apparatus having a supplemental layer for forming a depletion zone.
Figure 9:
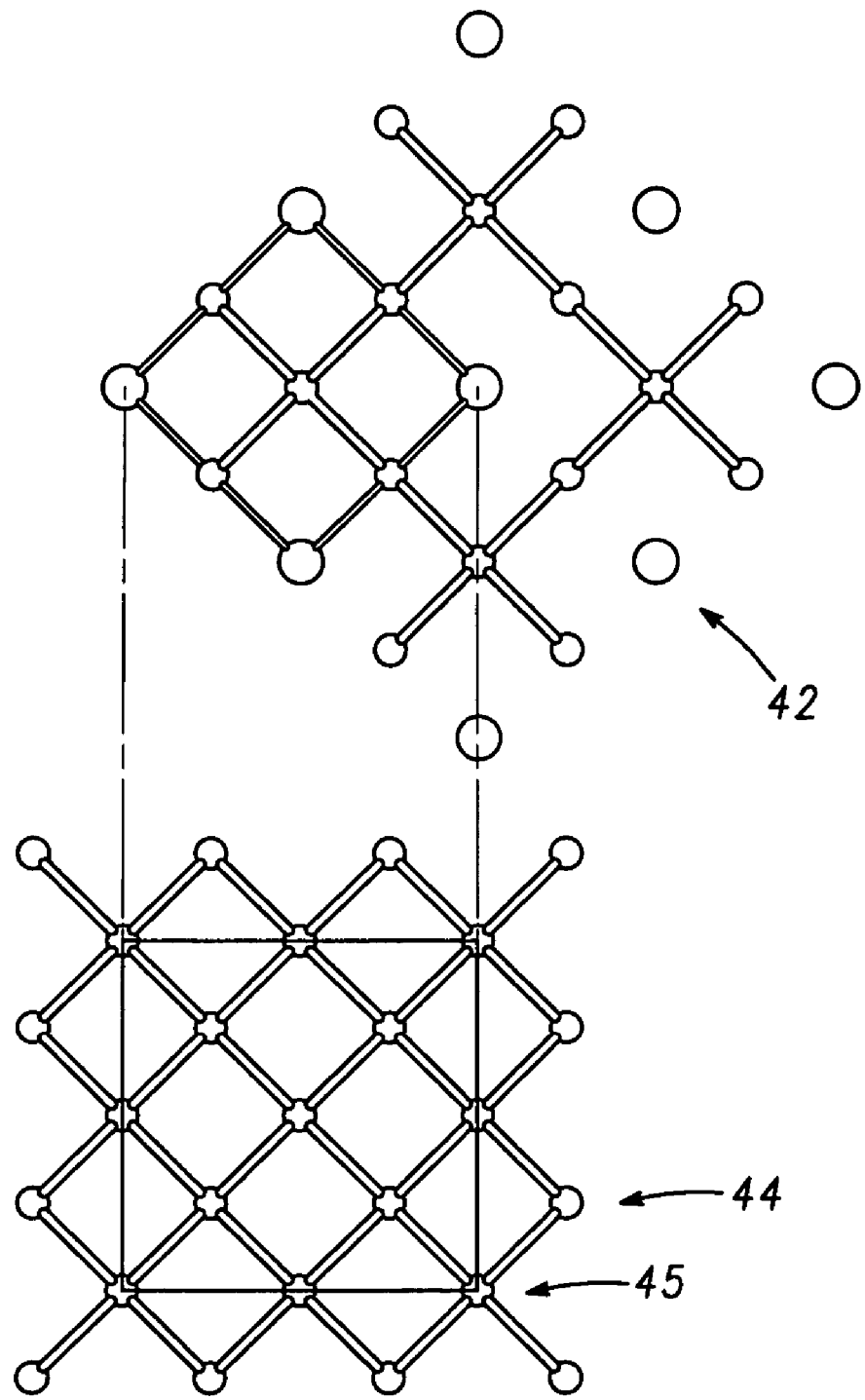
FIG. 9 illustrates, in two dimensions, the lattice structures of the (100) surfaces of a substrate, a high-resistivity layer, and a dielectric layer.
Figure 10:
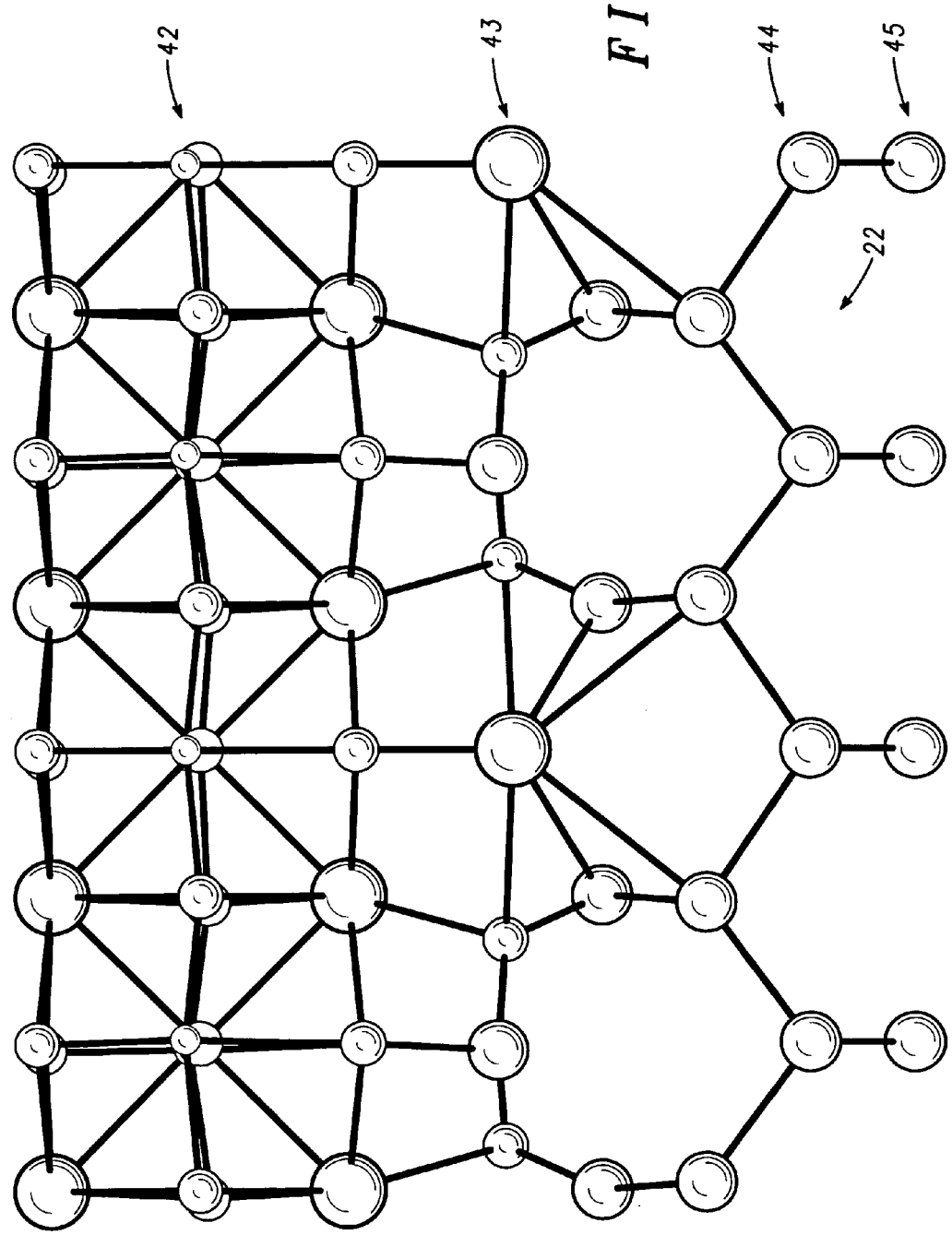
FIG. 10 illustrates lattice structures for a substrate, a high-resistivity layer, an interface layer, and a dielectric layer.

Referring to FIGS. 9 and 10, in an embodiment having the dielectric layer 42 directly atop the semiconductor substrate 45 or a high-resistivity layer 44 (e.g. as shown in FIGS. 1 and 7, respectively), the semiconductor substrate 45 and the high-resistivity layer 44 are comprised of silicon having a lattice constant of 5.43 angstroms, and dielectric layer 42 is comprised of strontium titanate ($SrTiO_3$) having a lattice constant of 3.9 angstroms. For the strontium titanate film of dielectric layer 42 to match the silicon lattice of substrate 45 or high-resistivity layer 44, the crystalline structure of dielectric layer 42 may be rotated at an angle, such as 45 degrees, relative to the silicon lattice of the high-resistivity layer 44 or semiconductor substrate 45 normal to the (100) growth direction. For example, suitable materials and techniques for orienting a layer with respect to another are described in U.S. Pat. No. 6,241,821, issued to Jun. 5, 2001 to Yu, et al., and U.S. Pat. No. 6,248,459, issued Jun. 19, 2001, to Wang, et al. At an angle of 45 degrees, the relative lattice constant of strontium titanate (3.90 angstroms× 1.414=5.51 angstroms), is comparable to the lattice constant of silicon (5.43 angstroms). In one embodiment, the lattice constants of the respective layers are within about 2%.

Figure 6:
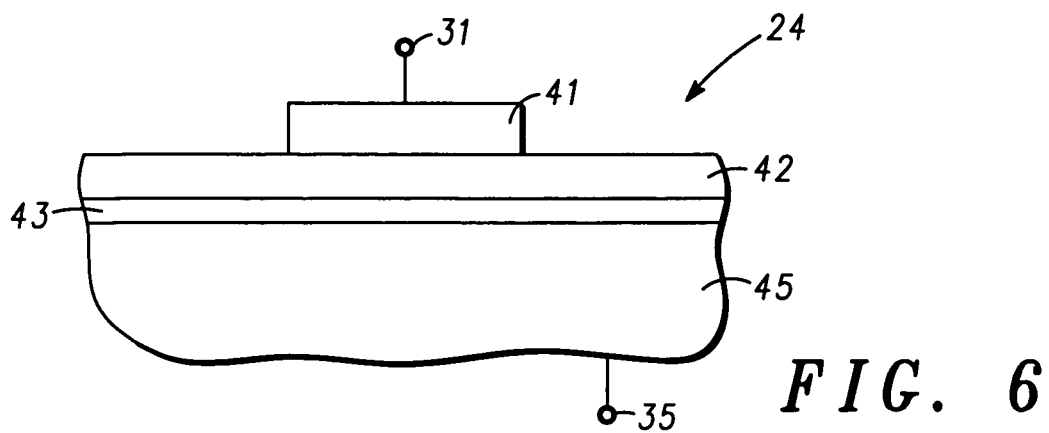
FIG. 6 illustrates a cross-section of a semiconductor apparatus having an interface layer.
Figure 8:
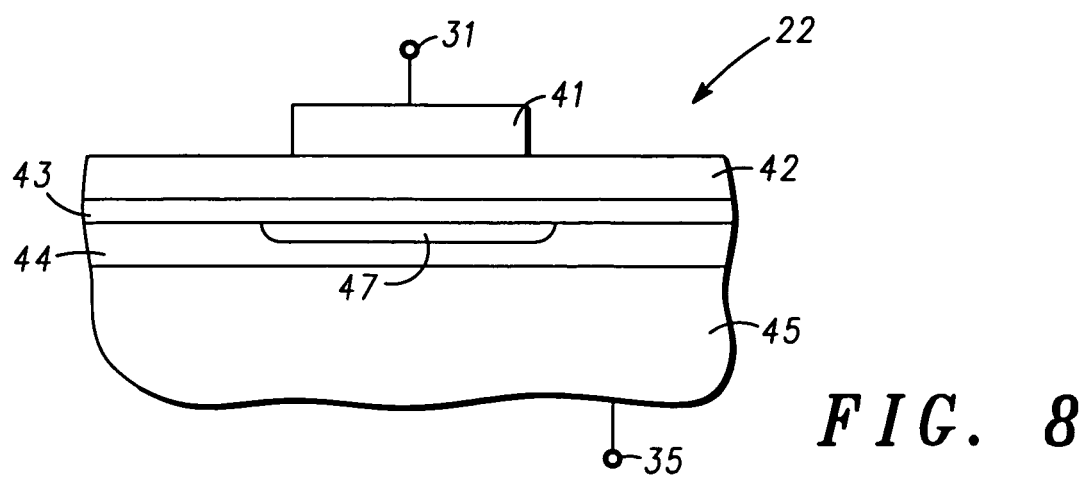
FIG. 8 illustrates a cross-section of a semiconductor apparatus having a supplemental layer for forming a depletion zone and an interface layer.

In an alternative embodiment including an interface layer 43 (e.g. as shown in FIGS. 6 and 8), the interface layer 43, suitably comprising strontium silicate (in which silicon, strontium, and oxygen atoms are bonded to form a (2×1) structure), strontium oxide, or other appropriate material, promotes the growth of the strontium titanate dielectric layer 42 in a 45-degree rotation with respect to the silicon high-resistivity layer 44 or substrate semiconductor substrate 45. Interface layer 43 may be as thin as a single layer of atoms.

A capacitor according to various aspects of the present invention may also be configured to include a supplemental layer for forming a depletion zone while the capacitor is operating. For example, referring to FIG. 7, a voltage-variable capacitor (VVC) 21 may include a supplemental layer, suitably comprising an epitaxial layer of high-resistivity semiconductor material 44, such as lightly doped single-crystal silicon, formed into the substrate 45 or positioned atop the substrate 45. Alternatively, the supplemental layer may be formed in conjunction with an interface layer 43 (FIG. 8) to facilitate the growth of the dielectric layer 42 over the supplemental layer.

The supplemental layer may serve as an area for a depletion zone 47 (often referred to as a barrier layer, a blocking layer, or a space-charged layer) to form, which facilitates a voltage-variable characteristic for the VVC 21. The depletion zone 47 is a transient layer formed when a bias voltage is applied to the capacitor. The depletion zone 47 may change or disappear when the applied voltage field is varied or removed. Depletion zone 47 is a region of net space-charge in a semiconductor in which the density of mobile charge elements tends to be significantly less than the density of ionized impurity atoms. The mobile carrier charge density is insufficient to neutralize the fixed charge density of donors and acceptors.

High-resistivity layer 44 may be formed or deposited in any suitable manner, such as by epitaxially growing the layer 44 on the semiconductor substrate 45, counter-doping the substrate 45, conventional photolithography and etching, or ion implantation. In the present embodiment, the high-resistivity layer 44 is preferably less heavily doped (n−) than heavily doped (n+) semiconductor substrate 45, and has a higher resistivity than semiconductor substrate 45. The thickness of the high-resistivity layer 44 may be chosen to be equal to or slightly greater than a maximum depletion width to minimize the series resistance of VVC 22 while maximizing the capacitance change. A lower doping level of high-resistivity layer 44 facilitates faster formation of the depletion zone 47. The physical thickness of the high-resistivity layer 44 provides a limitation on the maximum thickness of the depletion zone 47, thus providing a controlled maximum value to the variable capacitance.

In operation, a voltage is typically applied across VVC 21 by applying the voltage across connections 31, 35. The capacitance of the VVC 21 is controlled by adjusting the voltage applied across the connections 31, 35. When an appropriate voltage is applied to the connections 31, 35, depletion zone 47 forms which extends for a selected distance into the high-resistivity layer 44. The depletion zone 47 behaves as a variable capacitance electrically in series with the constant capacitance formed by the electrode 41 and the substrate 45. The two capacitances create a net capacitance effect that is affected by the width of the depletion zone 47. The bias voltage applied across connections 31, 35 controls the width of the depletion zone 47.

Figure 13:
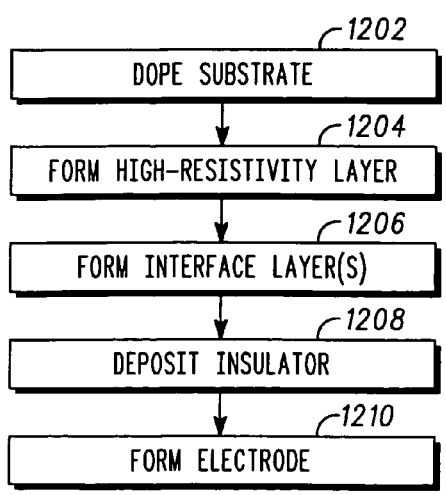
FIG. 13 is a flow diagram illustrating a method for fabricating a semiconductor apparatus according to various aspects of the present invention.

A semiconductor device according to various aspects of the present invention may be fabricated in any suitable manner to achieve the desired characteristics of the device and form the desired layers. For example, referring to FIG. 13, a semiconductor device may be formed by doping the substrate 45 (step 1202), such as a silicon substrate; depositing the single-crystal dielectric layer 42 on the substrate 45 (step 1208), the dielectric layer 42 having a lattice constant substantially matching that of the semiconductor substrate 45; and forming an electrode 41 on the dielectric layer 42 (step 1210). The step of doping the substrate 45 may comprise n+ doping the substrate 45. The process may further include a step of forming an interface layer 43 between the substrate 45 and the dielectric layer 42 (step 1206).

The fabrication process may further include a step of forming the high resistivity layer 44 on the substrate 45 (step 1204). The high resistivity layer 44 (as well as the other layers of the device) is suitably epitaxially grown silicon and lightly n doped, which may then be selectively removed using conventional photolithography and etching. In another embodiment, the step of forming the high resistivity layer 44 may include ion implantation of doping impurities. An interface layer 43 may also be formed on the high resistivity layer (step 1206), such as by forming a single crystal material which is substantially lattice matched to the substrate 45.

Figure 14:
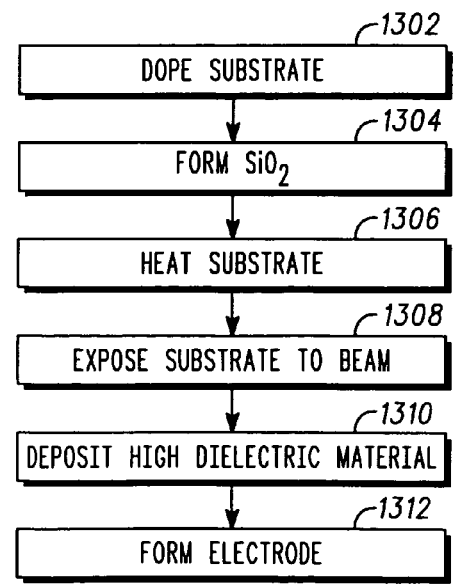
FIG. 14 is a flow diagram of an alternative method for fabricating a semiconductor apparatus.

Referring to FIG. 14, an alternative method for fabricating a device, such as a capacitor, comprises the steps of: providing a silicon substrate 45; heavily doping a region of the silicon substrate 45 (step 1302); forming silicon dioxide on a surface of the region (step 1304); heating the silicon substrate to a temperature below the sublimation temperature of the silicon dioxide (step 1306); exposing the surface of the region to a beam of alkaline earth metal (step 1308); depositing a high dielectric constant material 42 (step 1310); and forming an electrode 41 on the region (step 1312). In another embodiment, the surface of the region is exposed to beams of alkaline earth metal and oxygen; depositing a high dielectric constant material 42; and forming an electrode 41 on the region. The silicon substrate 45 is preferably maintained through all the steps at a temperature below 850° C., and the step of heating the silicon substrate to a temperature below the sublimation temperature of the silicon dioxide is suitably accomplished by heating the silicon substrate to a temperature between 700° C. and 800° C. In addition, the step of exposing the surface of the doped region to a beam of alkaline earth metal or beams of alkaline earth metal and oxygen may be performed at a reduced pressure, for example in the range of $10^{-7}$ to $10^{-10}$ Torr. Surface structures during these steps may be monitored with RHEED techniques.

Various aspects of the present invention may be applied to integrated circuits of multiple devices, including capacitors in integrated circuits. Additionally, monocrystalline dielectric layers may be deposited on substrates commonly used in the semiconductor industry such that capacitors or VVCs may be integrated with other elements of integrated circuits such as transistors. This allows for the integration of an RF front-end module on a single chip. In this embodiment, the substrate is silicon but could also be chosen from the group III-V semiconductors.

Figure 11:
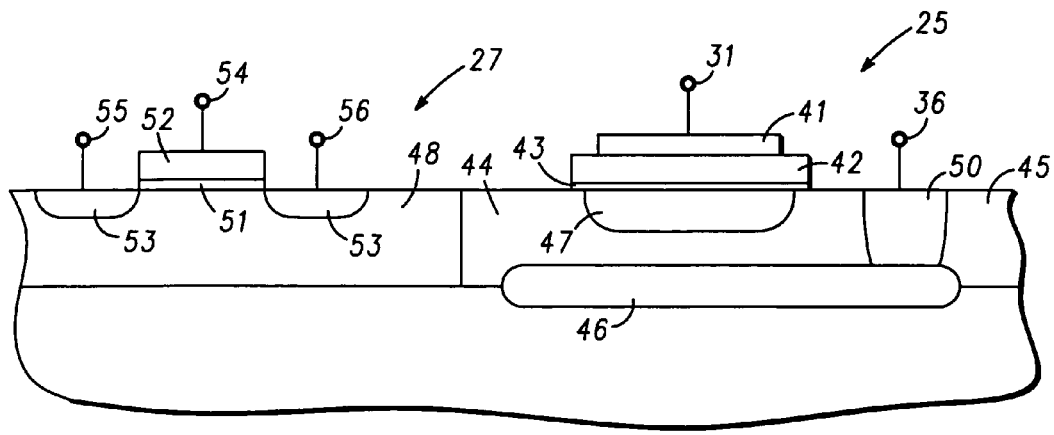
FIG. 11 illustrates a cross-section of a semiconductor apparatus having multiple devices.

For example, referring to FIG. 11, an integrated circuit suitably includes a voltage-variable capacitor (VVC) 25 and another device 27, such as a MOS transistor. The VVC 25 according to the present embodiment includes a heavily doped (n+) region 46 in the semiconductor substrate 45. The VVC 25 suitably includes a high-resistivity layer 44 that covers the doped region 46. Doped region 46 may be electrically attached to connection 36 by means of an n+ doped region 50 so that voltage may be applied across capacitor 25 via connections 31, 36. The VVC 25 further suitably includes an interface layer 43 to assist in the proper formation of the dielectric layer 42 in the desired orientation.

Other doped regions 48 may also be included in the substrate 45 to provide other devices 27. For example, device 27 may be a field effect transistor, including a gate insulator 51, a gate electrode 52, a gate terminal 54, a source/drain implant region 53, and source and drain electrodes 55, 56. The fabrication of such field effect transistors on a substrate may be performed in any suitable manner, such as according to conventional fabrication techniques. Other devices 27 also suitably comprise other semiconductor components that may be formed within or placed on the other doped regions similar to doped region 48 of semiconductor substrate 45 to form other devices 27. The other semiconductor devices 27 and other semiconductor components may be connected to VVC 25 to form integrated circuits. Such a voltage variable capacitor may be utilized, for example, in an integrated circuit that tunes a frequency dependent portion of a radio circuit. For example, the VVC can be coupled to another capacitor in an oscillator. By varying the voltage on the VVC, the capacitance changes, thus shifting the frequency of the oscillator. The voltage to the capacitor can be changed under control of a transistor that is fabricated upon the same substrate as the VVC.

Figure 12:
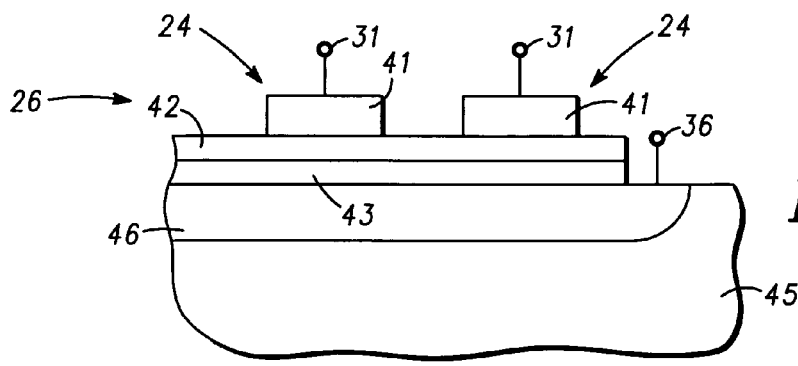
FIG. 12 illustrates a cross-section of a semiconductor apparatus having multiple capacitors.

Referring to FIG. 12, in another embodiment according to various aspects of the present invention, a semiconductor device may include a capacitor array 26 comprising a plurality of capacitors 24. The capacitors 24 in capacitor array 26 may have different size electrodes 41 resulting in different capacitances. Further, the capacitors 24 in capacitor array 26 may be connected or unconnected to each other to provide desired characteristics.

The substrate 45 may include a heavily doped (n+) region 46 shared by multiple components. In addition, the capacitor array 26 may include the interface layer 43 to assist in the proper formation of the subsequent dielectric layer 42 in the proper orientation, which may also be shared by multiple capacitors 24. Other layers, such as a high-resistivity layer (not shown), may be shared among one or more capacitors as well. The shared doped region 46 is suitably electrically coupled to the connection 36. Thus, the capacitors in capacitor array 26 share a common connection 36, but each has its own electrode connection 31.

EXAMPLE

Figure 15:
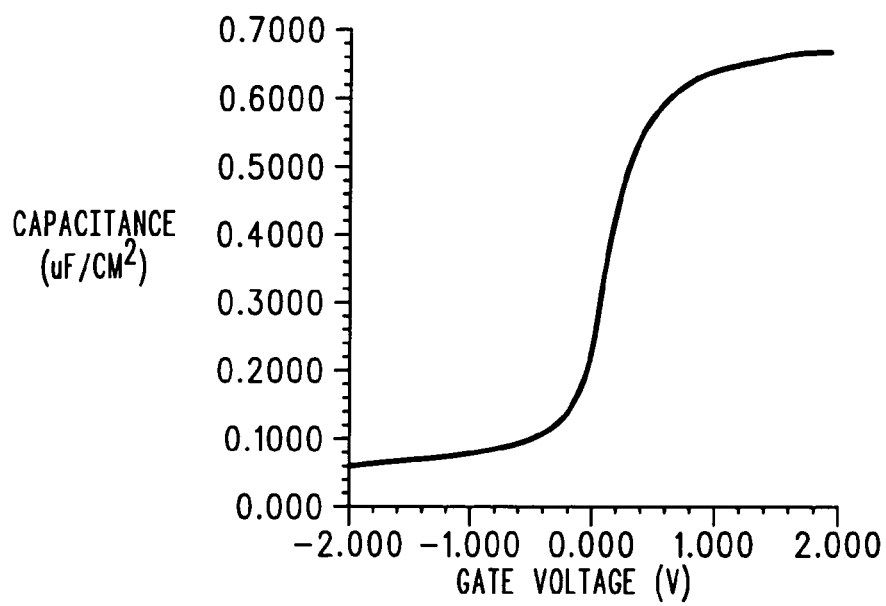
FIGS. 15 and 16 are performance plots for a voltage variable capacitor constructed in accordance with various aspects of the present invention.
Figure 16:
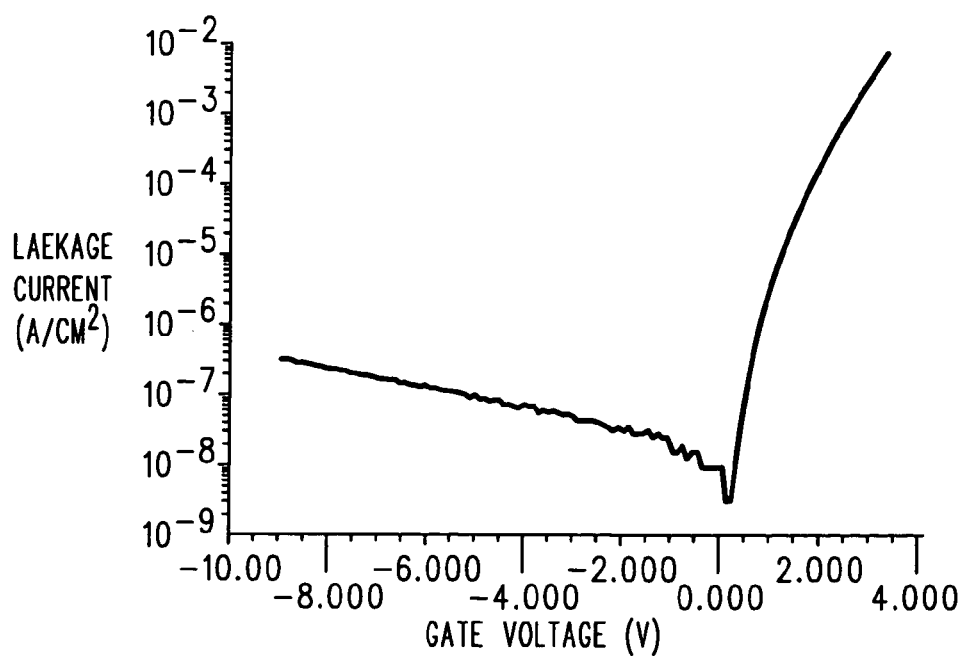

FIG. 15 shows a capacitance versus voltage plot and FIG. 16 shows a leakage current versus voltage plot for a voltage variable capacitor constructed in accordance with various aspects of the present invention. The capacitor includes a high-resistivity layer 44 such as is described in FIG. 7. The thickness of the strontium titanate insulating layer is 1000 angstroms. The silicon substrate is heavily n+ doped, with a light n doped epitaxial high resistivity layer. The resulting capacitance is 0.65 uF/cm2, which is more than twice that of conventional voltage variable capacitors made from amorphous or polycrystalline zirconium titanate. The leakage current is 3E-4 mA/cm2 compared to leakage currents of about 0.5 mA/cm2 for conventional VVCs. The substantially reduced leakage is a result of the substantially single crystal dielectric which is lattice matched to the substrate, resulting in a substantially continuous crystal structure with substantially no dangling bonds, dislocations, grain boundaries, and the like.

Using high quality monocrystalline material, a variety of semiconductor devices may be fabricated in or use that film at a low cost compared to the cost of fabricating such devices beginning with a bulk wafer of semiconductor material or in an epitaxial film of such material on a bulk wafer of semiconductor material. In addition, a thin film of high quality monocrystalline material may be realized beginning with a bulk wafer such as a silicon wafer, such that an integrated device structure could be achieved that takes advantage of the properties of both the silicon and the high quality monocrystalline material. A capacitor, such as a voltage variable capacitor, may be created using the properties of the monocrystalline material in the insulator of the capacitor. The insulator comprises a substantially monocrystalline material having a relatively high dielectric constant. The semiconductor apparatus may further include a supplemental layer having a depletion zone, suitably comprised of a high-resistivity material, for forming a voltage-variable capacitor. To facilitate the growth of the insulator and/or other layers, the various layers are suitably lattice matched. Further, the apparatus may include one or more interface layers to facilitate lattice matching of the various layers.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In the foregoing specification, the invention has been described with reference to specific embodiments. However, various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The invention claimed is:

1. An integrated circuit having a voltage variable capacitor, the circuit including:
    a first semiconductor layer;
    a second semiconductor layer formed on the first semiconductor layer including a material having a higher resistivity than the first semiconductor layer;
    a conductive electrode; and
    an insulating layer formed between the second semiconductor layer and the electrode, the insulating layer including a substantially monocrystalline layer
    wherein the monocrystalline layer is substantially lattice matched to at least one of the first semiconductor layer and the second semiconductor layer.

2. An integrated circuit according to claim 1, wherein the monocrystalline layer includes at least one of a metal oxide, metal nitride, alkaline earth metal titanate, alkaline earth metal zirconate, alkaline earth metal hafnate, alkaline earth metal tantalate, alkaline earth metal niobate, alkaline earth metal vanadate, alkaline earth metal tin-based perovskite, lanthanum aluminate, lanthanum scandium oxide, alkaline earth oxides, gallium nitride, aluminum nitride, boron nitride, strontium titanate, $BaTiO_3$, $LaAlO_3$, $SrZrO_3$, $BaZrO_3$, and MgO.

3. An integrated circuit according to claim 1, wherein a structure of the monocrystalline layer is rotated approximately 45 degrees with respect to a structure of the at least one of the first semiconductor layer and the second semiconductor layer.

4. An integrated circuit according to claim 1, wherein the insulating layer is formed epitaxially.

5. An integrated circuit according to claim 1, further including an interface layer disposed between the insulating layer and the second semiconductor layer.

6. An integrated circuit according to claim 5, wherein the interface layer includes at least one of a metal oxide, metal nitride, gallium nitride, aluminum nitride, boron nitride, strontium silicate, and strontium oxide.

7. A semiconductor device, including:
    a semiconductor material;
    a conductive element; and
    a substantially monocrystalline insulator disposed between the semiconductor material and the conductive element
    wherein the insulator is substantially lattice matched to the semiconductor material, and wherein the semiconductor device includes a capacitor,
    wherein said device further includes a high-resistivity layer disposed between the insulator and the semiconductor material.

8. A semiconductor device according to claim 7, wherein the semiconductor material includes a silicon substrate.

9. A semiconductor device according to claim 7, wherein the high-resistivity layer is an epitaxial layer.

10. A semiconductor device according to claim 7, wherein the semiconductor device includes a capacitor.

11. A semiconductor device according to claim 7, wherein the semiconductor device includes a voltage variable capacitor.

12. A semiconductor device according to claim 7, wherein the insulator is formed epitaxially.

13. A semiconductor device, including:
    a semiconductor material;
    a conductive element; and
    a substantially monocrystalline insulator disposed between the semiconductor material and the conductive element
    wherein the insulator is substantially lattice matched to the semiconductor material, and wherein the insulator includes at least one of a metal oxide, metal nitride, alkaline earth metal titanate, alkaline earth metal zirconate, alkaline earth metal hafnate, alkaline earth metal tantalate, alkaline earth metal niobate, alkaline earth metal vanadate, alkaline earth metal tin-based perovskite, lanthanum aluminate, lanthanum scandium oxide, gadolinium oxide, alkaline earth oxides, gallium nitride, aluminum nitride, boron nitride, strontium titanate, $BaTiO_3$, $LaAlO_3$, $SrZrO_3$, $BaZrO_3$, and MgO.

14. A semiconductor device according to claim 13, wherein the insulator includes strontium titanate.

15. A semiconductor device according to claim 13, wherein the structure of the insulator is rotated approximately 45 degrees with respect to the structure of the semiconductor material.

16. A semiconductor device, including:
    a semiconductor material;
    a conductive element; and
    a substantially monocrystalline insulator disposed between the semiconductor material and the conductive element
    wherein the insulator is substantially lattice matched to the semiconductor material, the semiconductor device further including an interface layer disposed between the insulator and the semiconductor material,
wherein the interface layer includes at least one of a metal oxide, metal nitride, gallium nitride, aluminum nitride, boron nitride, strontium silicate, and strontium oxide.

17. A radio circuit having a frequency dependent circuit, the frequency dependent circuit including at least one voltage variable capacitor, and the voltage variable capacitor including:
a semiconductor substrate;
a high resistivity semiconductor layer on the semiconductor substrate;
a substantially monocrystalline dielectric layer formed on the high resistivity layer; and
an electrode formed on the dielectric layer
wherein the dielectric layer is substantially lattice matched to the high resistivity semiconductor layer.

18. A radio circuit according to claim 17, wherein the dielectric layer includes at least one of a metal oxide, metal nitride, alkaline earth metal titanate, alkaline earth metal zirconate, alkaline earth metal hafnate, alkaline earth metal tantalate, alkaline earth metal niobate, alkaline earth metal vanadate, alkaline earth metal tin-based perovskite, lanthanum aluminate, lanthanum scandium oxide, gadolinium oxide, alkaline earth oxides, gallium nitride, aluminum nitride, boron nitride, strontium titanate, $BaTiO_3$, $LaAlO_3$, $SrZrO_3$, $BaZrO_3$, and MgO.

19. A radio circuit according to claim 17, wherein the structure of the dielectric layer is rotated approximately 45 degrees with respect to the structure of the high resistivity semiconductor layer.

20. A radio circuit according to claim 17, wherein the dielectric layer includes strontium titanate.

21. A radio circuit according to claim 17, further including an interface layer disposed between the dielectric layer and the semiconductor substrate.

22. A radio circuit according to claim 21, wherein the interface layer includes at least one of a metal oxide, metal nitride, gallium nitride, aluminum nitride, boron nitride, strontium silicate, and strontium oxide.

23. A voltage variable thin film capacitor, comprising;
a first semiconductor layer;
a second semiconductor layer of a higher resistivity semiconductive material formed on the first semiconductor layer;
an insulating layer formed on the second semiconductor layer comprising a thin film of substantially monocrystalline material; and
a conductive electrode formed on the insulating layer
wherein the structure of the monocrystalline material is substantially lattice matched to at least one of the first or second semiconductor layer.

24. A voltage variable thin film capacitor according to claim 23, wherein the monocrystalline material comprises at least one of a metal oxide, metal nitride, alkaline earth metal titanate, alkaline earth metal zirconate, alkaline earth metal hafnate, alkaline earth metal tantalate, alkaline earth metal niobate, alkaline earth metal vanadate, alkaline earth metal tin-based perovskite, lanthanum aluminate, lanthanum scandium oxide, gadolinium oxide, alkaline earth oxides, gallium nitride, aluminum nitride, boron nitride, strontium titanate, $BaTiO_3$, $LaAlO_3$, $SrZrO_3$, $BaZrO_3$, and MgO.

25. A voltage variable thin film capacitor according to claim 23, wherein the structure of the monocrystalline material is rotated approximately 45 degrees with respect to the structure of the at least one of the first or second semiconductor layer.

26. A voltage variable thin film capacitor according to claim 23, wherein the insulating layer is formed epitaxially.

27. A voltage variable thin film capacitor according to claim 23, further including an interface layer disposed between the insulating layer and the second semiconductor layer.

28. A voltage variable thin film capacitor according to claim 27, wherein the interface layer is comprised of at least one of a metal oxide, metal nitride, gallium nitride, aluminum nitride, boron nitride, strontium silicate, and strontium oxide.

* * * * *